United States Patent
Park et al.

(10) Patent No.: US 12,362,335 B2
(45) Date of Patent: Jul. 15, 2025

(54) DISPLAY DEVICE USING MICRO LED AND METHOD OF MANUFACTURING SAME

(71) Applicant: LG ELECTRONICS INC., Seoul (KR)

(72) Inventors: Chilkeun Park, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 496 days.

(21) Appl. No.: 17/764,482

(22) PCT Filed: Oct. 7, 2019

(86) PCT No.: PCT/KR2019/013120
§ 371 (c)(1),
(2) Date: Mar. 28, 2022

(87) PCT Pub. No.: WO2021/070977
PCT Pub. Date: Apr. 15, 2021

(65) Prior Publication Data
US 2022/0399313 A1      Dec. 15, 2022

(30) Foreign Application Priority Data
Oct. 7, 2019   (KR) .................. 10-2019-0123837

(51) Int. Cl.
*H01L 25/075*   (2006.01)
*H01L 21/683*   (2006.01)
(Continued)

(52) U.S. Cl.
CPC ...... *H01L 25/0753* (2013.01); *H01L 21/6835* (2013.01); *H10H 20/84* (2025.01);
(Continued)

(58) Field of Classification Search
CPC ... H01L 33/08; H01L 33/0045; H01L 33/005; H01L 33/0079; H01L 33/0093;
(Continued)

(56) References Cited

U.S. PATENT DOCUMENTS 11,296,268 B1*  4/2022  Sengül ............ H01L 25/50
2011/0175860 A1*  7/2011  Kojima ............ H01L 33/20
345/204

(Continued)

FOREIGN PATENT DOCUMENTS

JP    2007-19467 A      1/2007
KR   10-2019-0085892 A   7/2019
(Continued)

*Primary Examiner* — Natalia A Gondarenko
(74) *Attorney, Agent, or Firm* — Birch, Stewart, Kolasch & Birch, LLP

(57) ABSTRACT

The present specification provides a display device using a semiconductor light emitting element that self-assembles in a fluid, and a method for manufacturing same. The semiconductor light emitting element is a horizontal semiconductor light emitting element, and has a plurality of mesa structures on one surface thereof to enable unidirectional assembly in a fluid. Further, a transparent electrode layer can be formed on the one surface including the mesa structures to improve luminous efficiency.

16 Claims, 25 Drawing Sheets

(51) Int. Cl.
  *H10H 20/01* (2025.01)
  *H10H 20/84* (2025.01)
  *H10H 20/857* (2025.01)

(52) U.S. Cl.
  CPC . *H10H 20/857* (2025.01); *H01L 2221/68354* (2013.01); *H01L 2221/68363* (2013.01); *H10H 20/034* (2025.01); *H10H 20/0364* (2025.01)

(58) Field of Classification Search
  CPC ... H01L 33/0095; H01L 33/14; H01L 33/382; H01L 33/387; H01L 33/32; H01L 33/36; H01L 33/42; H01L 33/44; H01L 33/62; H01L 33/20; H01L 25/0753; H01L 24/95; H01L 2224/0344; H01L 2224/16225; H01L 2224/81001; H01L 2224/95; H01L 2933/0025; H01L 2933/0066; H01L 2933/0016; H01L 27/1214; H01L 27/1218; H01L 27/156; H01L 21/6835; H01L 21/76895; H01L 2221/68354; H01L 2221/68363; H10H 20/0133; H10H 20/017; H10H 20/034; H10H 20/0362; H10H 20/0364; H10H 20/032; H10H 20/042; H10H 20/81; H10H 20/819; H10H 20/8142; H10H 20/821; H10H 20/825; H10H 20/833; H10H 20/018; H10H 20/01; H10H 20/84; H10H 20/8312; H10H 20/8508; H10H 20/857; H10H 20/862; H10H 20/882; H10H 29/142
  USPC .................................................. 257/88, 89
  See application file for complete search history.

(56) References Cited

U.S. PATENT DOCUMENTS

| | | | |
|---|---|---|---|
| 2012/0135158 A1* | 5/2012 | Freer | H01L 21/67703 427/532 |
| 2013/0026519 A1* | 1/2013 | Huang | H01L 33/46 257/98 |
| 2015/0041836 A1 | 2/2015 | Saito et al. | |
| 2018/0090639 A1* | 3/2018 | Ting | H01L 33/0093 |
| 2019/0006564 A1 | 1/2019 | Sasaki et al. | |
| 2021/0098431 A1* | 4/2021 | Yoon | H01L 23/13 |

FOREIGN PATENT DOCUMENTS

| | | |
|---|---|---|
| KR | 10-2019-0088929 A | 7/2019 |
| KR | 10-2019-0104277 A | 9/2019 |
| KR | 10-2019-0105537 A | 9/2019 |

\* cited by examiner

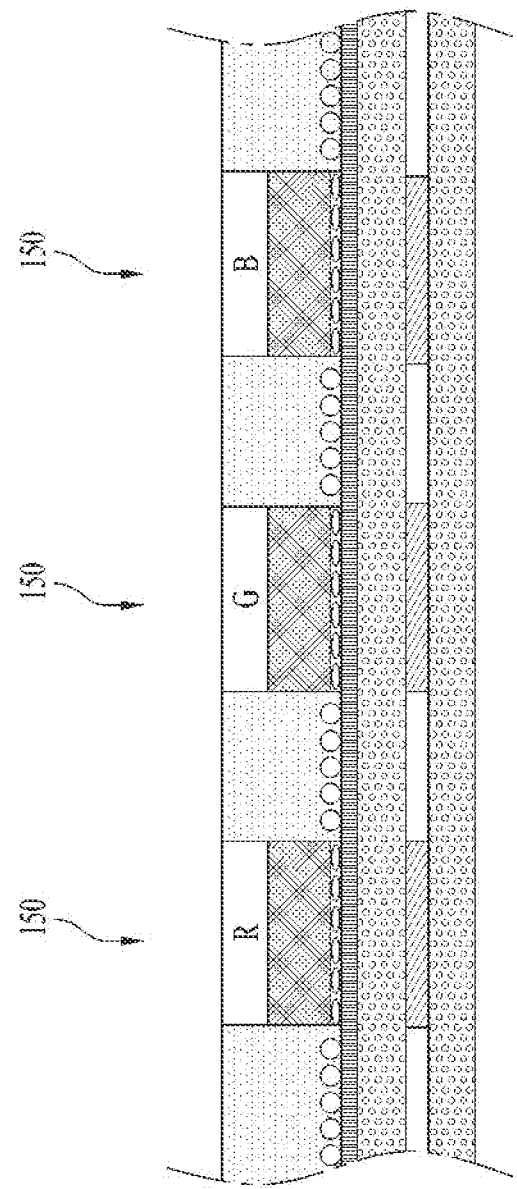

(a)

(b)

(a)

(b)

(a)

(b)

(a)

(b)

(a)

(b)

DISPLAY DEVICE USING MICRO LED AND METHOD OF MANUFACTURING SAME

CROSS REFERENCE TO RELATED APPLICATIONS

This application is the National Stage filing under 35 U.S.C. 371 of International Application No. PCT/KR2019/013120, filed on Oct. 7, 2019, which claims the benefit of earlier filing date and right of priority to Korean Application No. 10-2019-0123837 filed on Oct. 7, 2019, the contents of all these applications are hereby incorporated by reference herein in their entirety.

TECHNICAL FIELD

The present disclosure relates to technology related to a display device, and more particularly to a method for manufacturing a display device using a micro-light emitting diode (micro-LED) and a substrate used in manufacturing the display device.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

In order to implement a display device using such semiconductor light emitting elements, a very large number of semiconductor light emitting elements must be mounted on a substrate. Recently, a pick & place method using a transfer substrate or methods for assembling the semiconductor light emitting elements on the substrate in a fluid are being studied.

However, there are still many problems to be ameliorated in terms of a manufacturing cost, an assembly speed, and a light emission efficiency.

Accordingly, the present disclosure proposes a new type of semiconductor light emitting element having a high light emission efficiency that is self-assembled in the fluid and a method for manufacturing a display device using the same.

DISCLOSURE

Technical Problem

An object of an embodiment of the present disclosure is to provide a display device and a method for manufacturing the same using a semiconductor light emitting element.

Another object of an embodiment of the present disclosure is to provide a horizontal type semiconductor light emitting element that is assembled in one direction in a fluid and has an improved light emission efficiency, and a display device using the same.

Further, another object of the present disclosure is to solve various problems not mentioned herein. Those skilled in the art will appreciate the embodiments of the present disclosure through the description and drawings to be described later.

Technical Solutions

In a display device using a semiconductor light emitting element for achieving the above objects, the semiconductor light emitting element includes a first conductivity type semiconductor layer, a second conductivity type semiconductor layer positioned on the first conductivity type semiconductor layer, wherein the second conductivity type semiconductor layer includes an opening defined therein, an active layer disposed between the first conductivity type semiconductor layer and the second conductivity type semiconductor layer, a first conductivity type electrode positioned on a bottom surface of the opening, wherein the first conductivity type electrode is electrically connected to the first conductivity type semiconductor layer, and a second conductivity type electrode positioned on the second conductivity type semiconductor layer, and an edge of the opening has a mesa structure with a portion of the second conductivity type semiconductor layer protruding.

As an embodiment, the second conductivity type electrode is composed of a transparent electrode, and the second conductivity type electrode is located on an entirety of a top surface of the second conductivity type semiconductor layer including a top surface of the mesa structure.

As an embodiment, the assembly substrate includes assembly electrodes for generating a dielectrophoretic force in a relationship with the semiconductor light emitting element by the electric field.

As an embodiment, the mesa structure includes a first sidewall formed by partially etching the second conductivity type semiconductor layer, and a second sidewall formed by partially etching the second conductivity type semiconductor layer, the active layer, and the first conductivity type semiconductor layer.

As an embodiment, a height of the first sidewall of the mesa structure is equal to or greater than an effective distance of the dielectrophoretic force acting on the semiconductor light emitting element by the assembly substrate.

As an embodiment, the semiconductor light emitting element further includes a passivation layer for covering a surface of the semiconductor light emitting element.

As an embodiment, the passivation layer includes a first passivation layer for surrounding a top surface and side surfaces of the semiconductor light emitting element, and a second passivation layer for surrounding a bottom surface of the semiconductor light emitting element.

As an embodiment, the second conductivity type electrode is positioned on the first sidewall of the mesa structure, and the first passivation layer is positioned on the second sidewall of the mesa structure.

As an embodiment, the mesa structure is a ring-shaped mesa structure.

As an embodiment, the semiconductor light emitting element includes an un-doped semiconductor layer on a bottom surface of the first conductivity type semiconductor layer.

As an embodiment, the semiconductor light emitting element includes a magnetic layer.

As an embodiment, the semiconductor light emitting element is an LED having a size of a micrometer unit (a micro-LED).

A method for manufacturing a display device using a semiconductor light emitting element according to another embodiment of the present disclosure includes an operation of forming a horizontal type semiconductor light emitting element having a mesa structure on one surface thereof on a growing substrate, an operation of transferring the semiconductor light emitting element onto a temporary substrate, an operation of forming an insulating layer on a bottom surface of the semiconductor light emitting element, an operation of separating the semiconductor light emitting element from the temporary substrate and putting the separated semiconductor light emitting element into a fluid, and an operation of assembling the semiconductor light emitting element in the fluid onto an assembly substrate using an electric field and a magnetic field.

As an embodiment, the operation of forming the semiconductor light emitting element includes an operation of stacking a first conductivity type semiconductor layer, an active layer, and a second conductivity type semiconductor layer, an operation of forming a mesa shape on a top surface of the second conductivity type semiconductor layer, an operation of forming a second conductivity type electrode on the top surface of the second conductivity type semiconductor layer including the mesa shape, an operation of forming the mesa structure having a ring shape by etching a region of a top surface of the mesa shape to expose the first conductivity type semiconductor layer, an isolation operation of defining the individual semiconductor light emitting elements through an etching process, an operation of forming a first conductivity type electrode on the exposed first conductivity type semiconductor layer, and an operation of forming a passivation layer on a top surface and side surfaces of the semiconductor light emitting element.

As an embodiment, the method further includes an operation of forming wiring electrodes electrically connected to the semiconductor light emitting element assembled onto the assembly substrate.

Advantageous Effects

According to one embodiment of the present disclosure, it is possible to provide a display device and a method for manufacturing the same using a semiconductor light emitting element.

Specifically, a horizontal type semiconductor light emitting element including a mesa structure on one surface is manufactured to enable one directional assembly in a fluid. The mesa structure may be formed by etching a partial region of a conductivity type semiconductor layer, and a transparent electrode layer may be formed on one surface including the mesa structure, thereby increasing a semiconductor light emission efficiency.

Further, according to another embodiment of the present disclosure, there are additional technical effects not mentioned here. Those skilled in the art can understand the present disclosure through the purposes of the specification and drawings.

DESCRIPTION OF DRAWINGS

FIGS. 5A to 5C are conceptual diagrams illustrating various examples of color implementation with respect to a flip-chip type semiconductor light emitting element.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
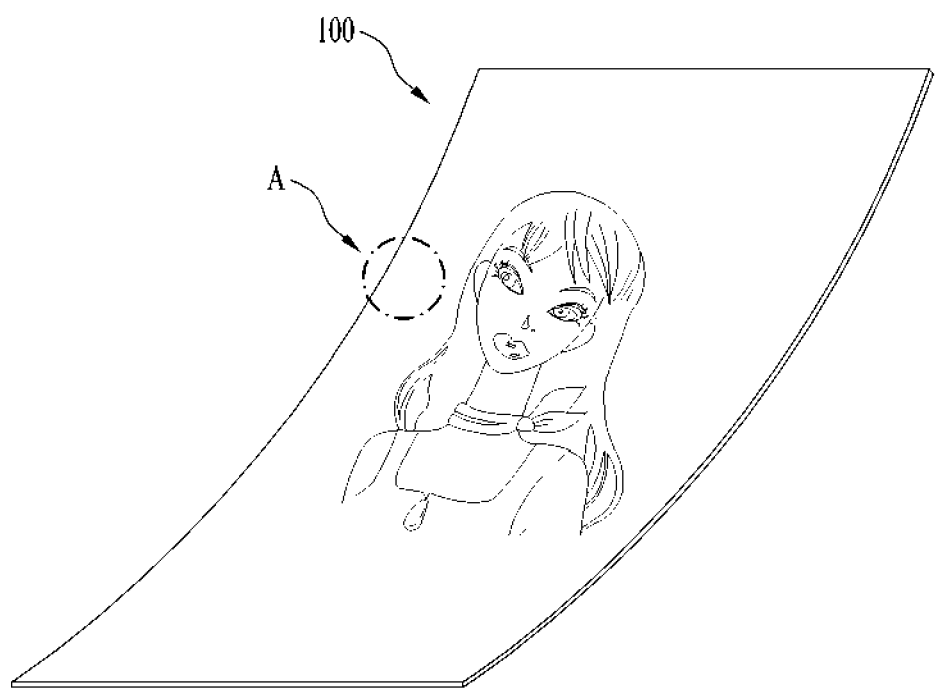
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
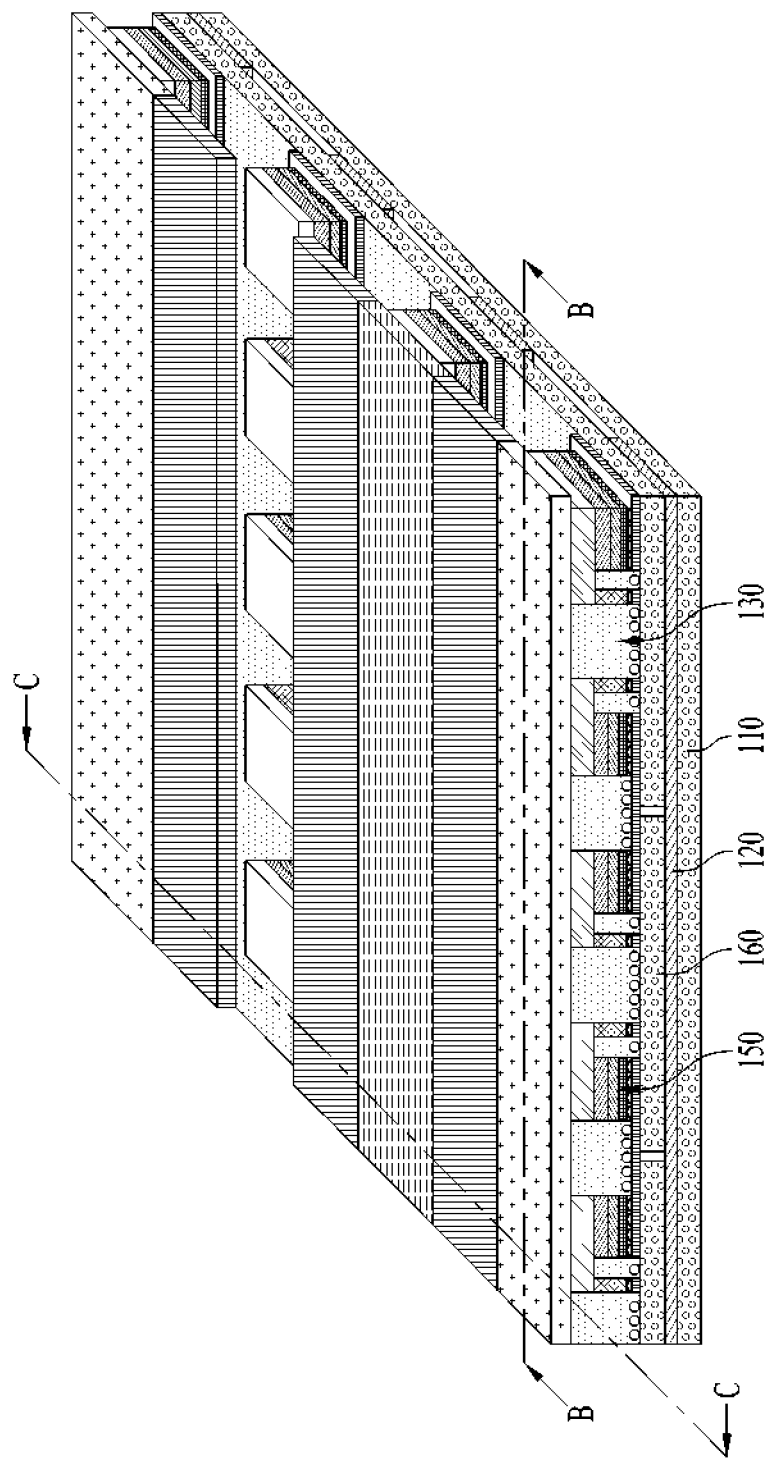
FIG. 2 is a partially enlarged diagram showing a part A shown in FIG. 1.

FIG. 2 is a partially enlarged view showing part A of FIG. 1.

Figure 3A:
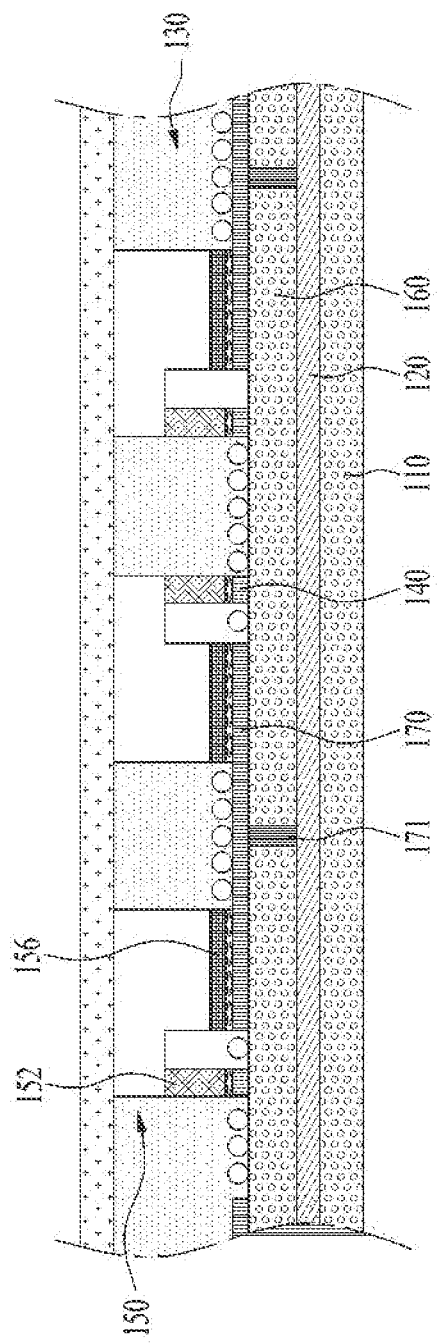
FIGS. 3A and 3B are cross-sectional diagrams taken along the cutting lines B-B and C-C in FIG. 2, respectively.
Figure 3B:
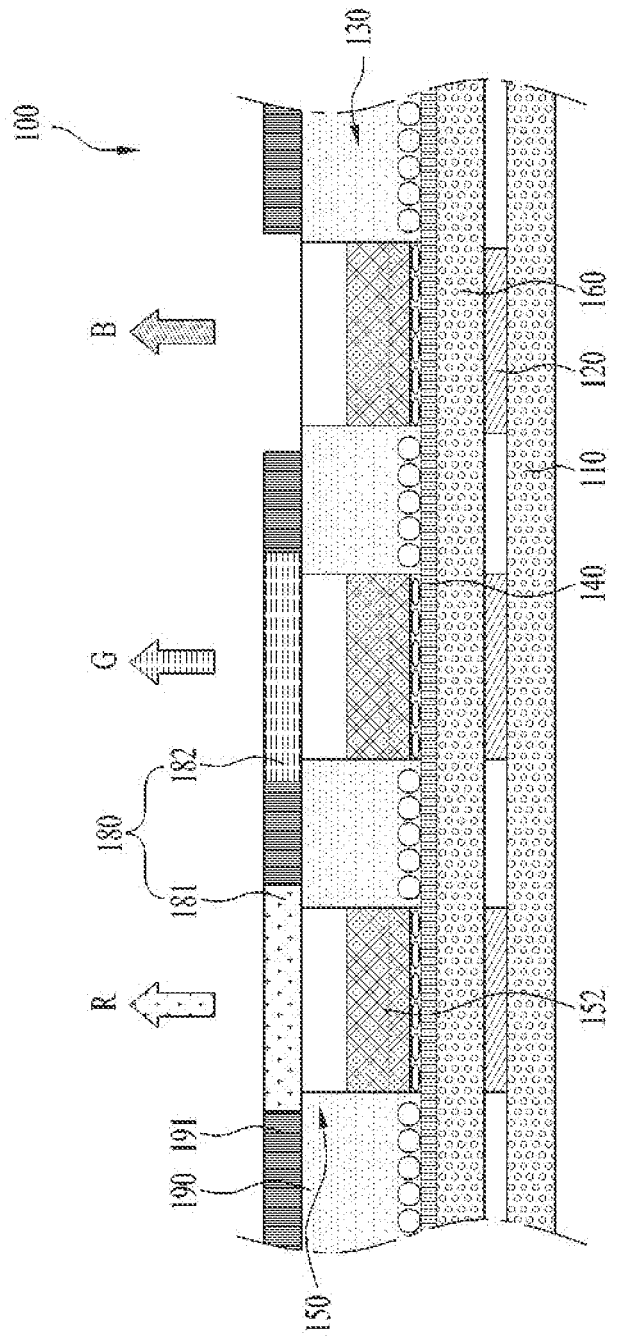

FIGS. 3A and 3B are cross-sectional views taken along lines B-B and C-C in FIG. 2.

Figure 4:
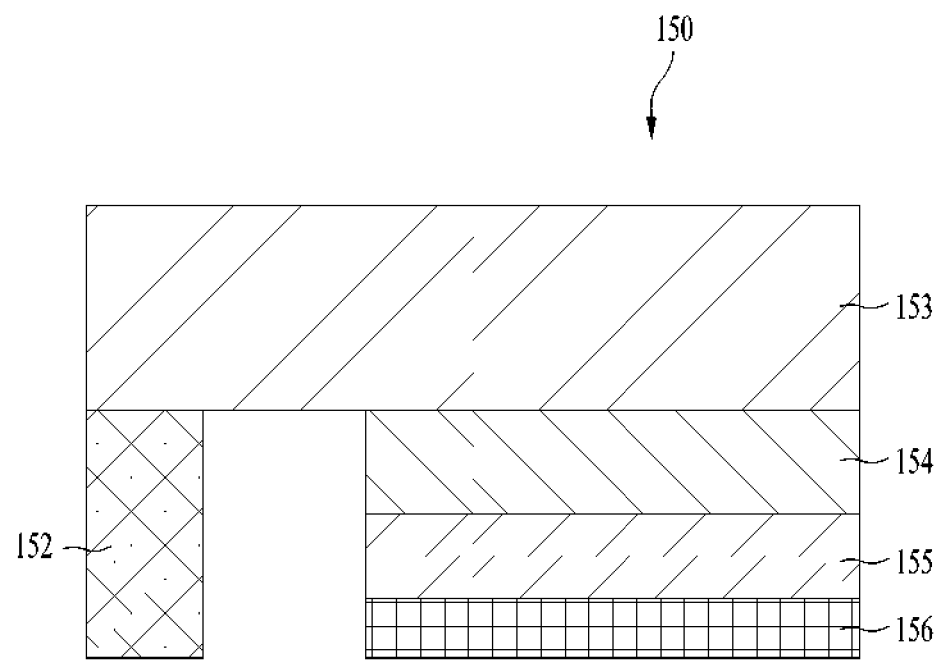
FIG. 4 is a conceptual diagram illustrating the flip-chip type semiconductor light emitting element of FIGS. 3A and 3B.

FIG. 4 is a conceptual view illustrating the flip-chip type semiconductor light emitting element of FIGS. 3A and 3B (also collectively referred to below as FIG. 3).

Figure 5B:
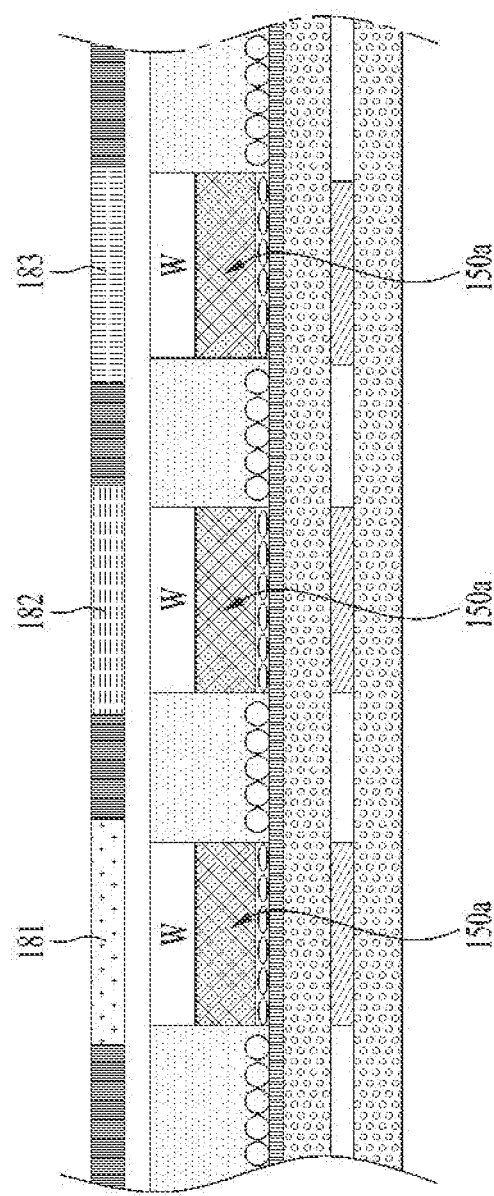
Figure 5C:
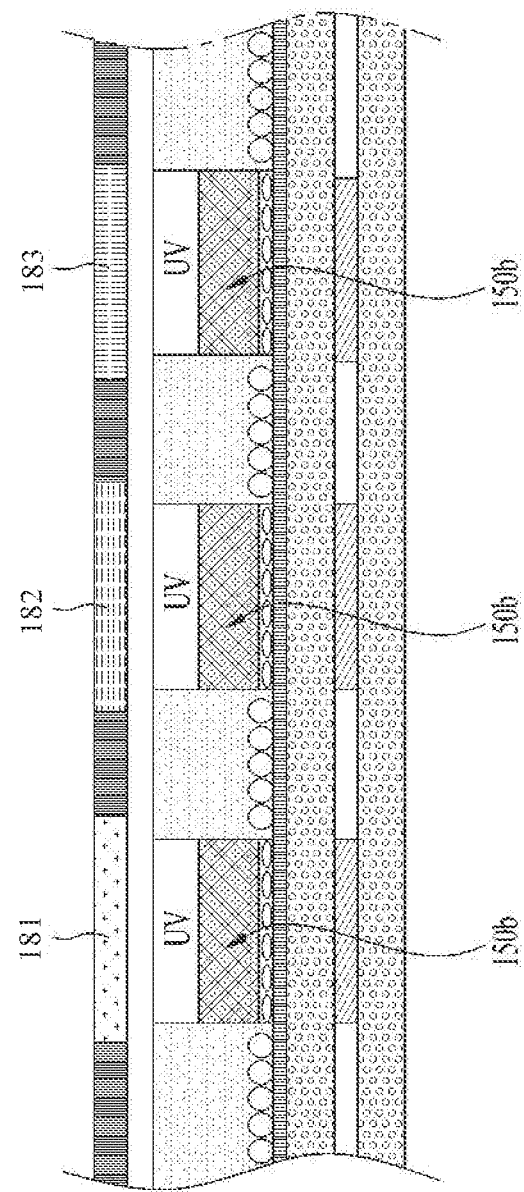

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 182, and a blue phosphor conversion layer 183 may be provided on an ultraviolet light emitting device. Not only visible light but also ultraviolet (UV) light may be used in the entire region of the semiconductor light emitting element 150b. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
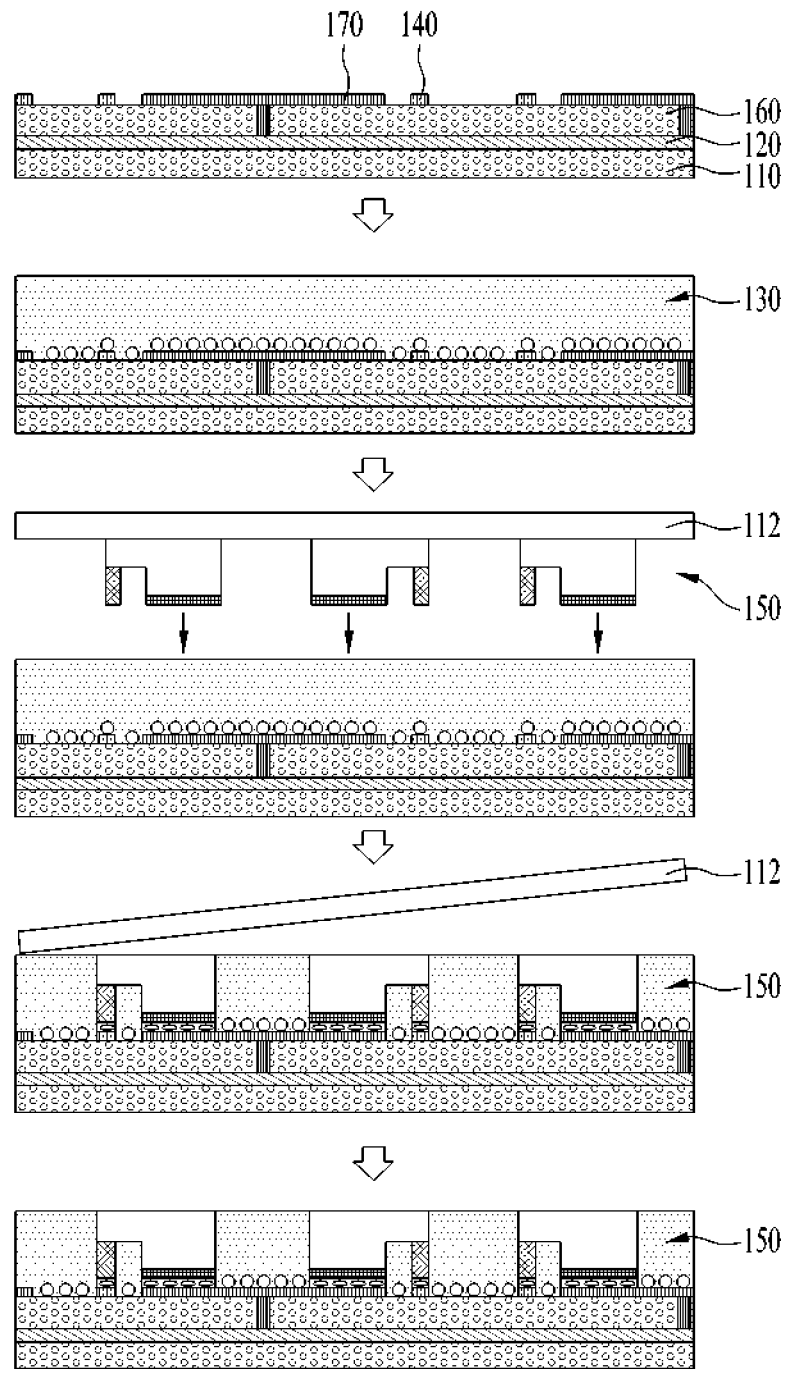
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
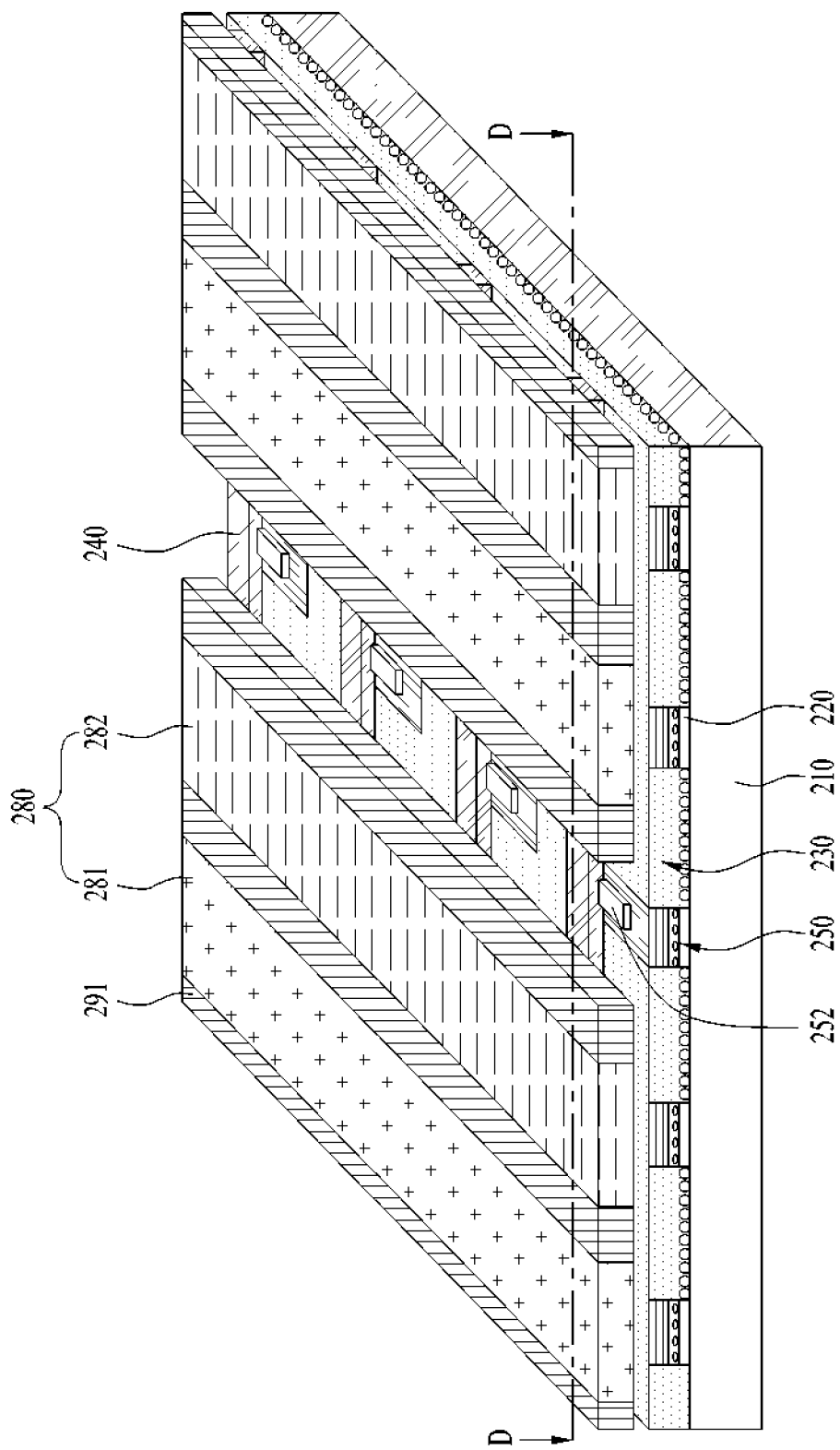
FIG. 7 is a perspective diagram of a display device using a semiconductor light emitting element according to another embodiment of the present disclosure.
Figure 8:
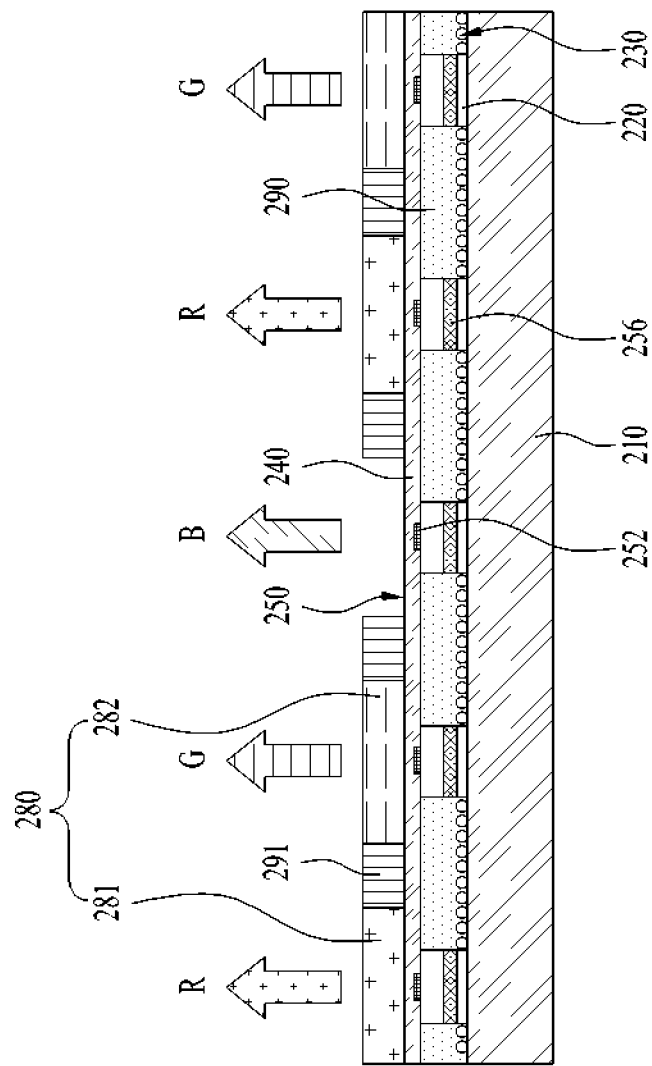
FIG. 8 is a cross-sectional diagram taken along a cutting line D-D shown in FIG. 7.
Figure 9:
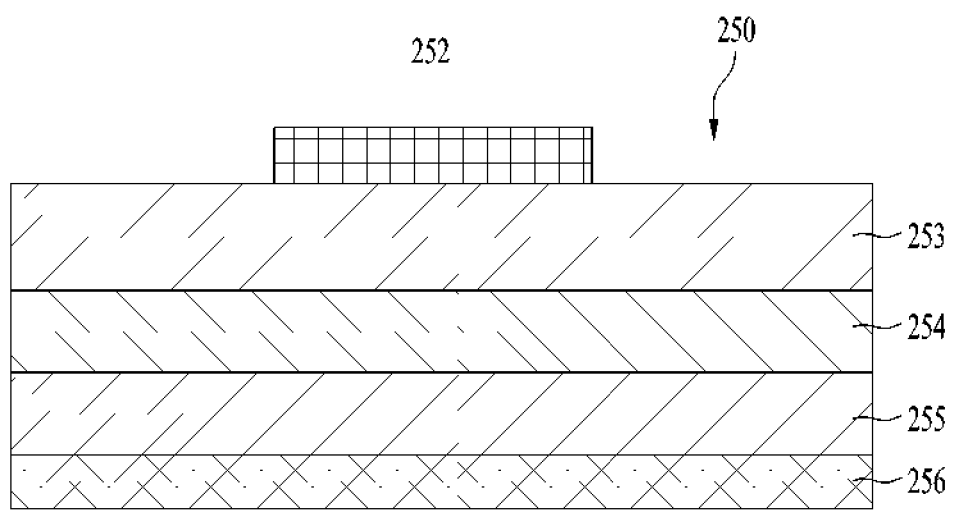
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 7, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include an n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
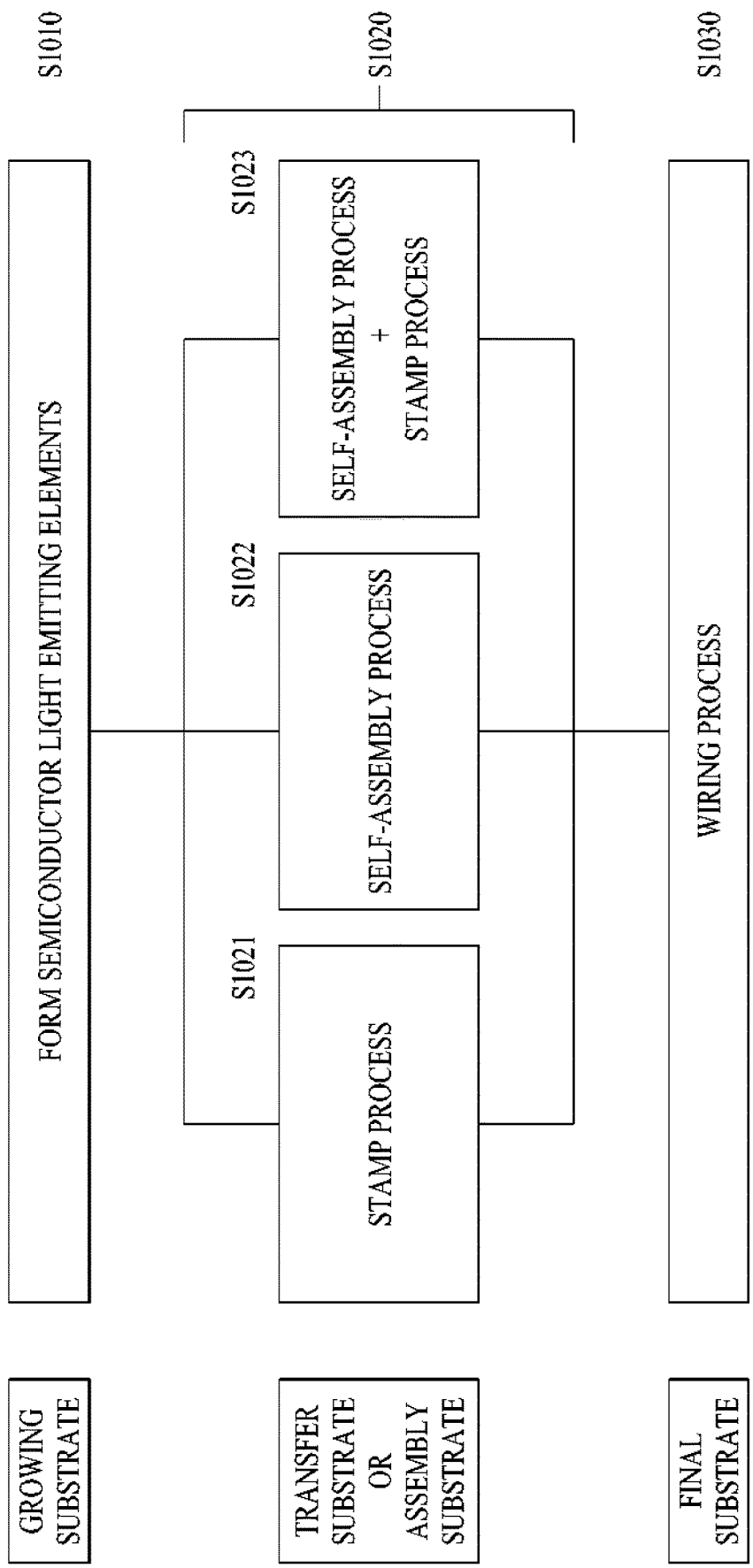
FIG. 10 is a diagram schematically illustrating a method for manufacturing a display device using a semiconductor light emitting element.

FIG. 10 is a diagram schematically illustrating a method for manufacturing a display device using a semiconductor light emitting element.

First, the semiconductor light emitting elements are formed on the growing substrate (S1010). The semiconductor light emitting elements may include a first conductivity type semiconductor layer, an active layer, and a second conductivity type semiconductor layer. In addition, a first conductivity type electrode formed on the first conductivity type semiconductor layer and a second conductivity type electrode formed on the second conductivity type semiconductor layer may be further included.

The semiconductor light emitting elements may be a horizontal type semiconductor light emitting element or the vertical type semiconductor light emitting element. However, in the case of the vertical type semiconductor light emitting element, because the first conductivity type electrode and the second conductivity type electrode face each other, a process of separating the semiconductor light emitting element from the growing substrate and forming a conductivity type electrode in one direction is added in a subsequent process. In addition, as will be described later, the semiconductor light emitting element may include a magnetic layer for a self-assembly process.

In order to utilize the semiconductor light emitting elements in the display device, in general, three types of semiconductor light emitting elements that emit light of colors corresponding to red (R), green (G), and blue (B) are required. Because semiconductor light emitting elements emitting light of one color are formed on one growing substrate, a separate substrate is required for the display device that implements individual unit pixels using the three types of semiconductor light emitting elements. Therefore, individual semiconductor light emitting elements must be separated from the growing substrate and assembled or transferred onto a final substrate. The final substrate is a substrate on which a process of forming a wiring electrode for applying a voltage to the semiconductor light emitting element such that the semiconductor light emitting element may emit light is performed.

Therefore, the semiconductor light emitting elements emitting the light of the respective colors may be transferred back to the final substrate after moving to the transfer substrate or the assembly substrate (S1020). In some cases, when performing the wiring process directly on the transfer substrate or the assembly substrate, the transfer substrate or the assembly substrate serves as the final substrate.

The method (S1020) for disposing the semiconductor light emitting element on the transfer substrate or the assembly substrate may be roughly divided into three types.

A first type is a method (S1021) for moving the semiconductor light emitting element from the growing substrate to the transfer substrate by the stamp process. The stamp process refers to a process of separating the semiconductor light emitting element from the growing substrate through a protrusion using a substrate that is made of a flexible material and having the adhesive protrusion. By adjusting a spacing and an arrangement of the protrusions, the semiconductor light emitting element of the growing substrate may be selectively separated.

A second type is a method (S1022) for assembling the semiconductor light emitting element onto the assembly substrate using the self-assembly process. For the self-assembly process, the semiconductor light emitting element must exist independently by being separated from the growing substrate, so that the semiconductor light emitting elements are separated from the growing substrate through a laser lift-off (LLO) process or the like as much as the required number of semiconductor light emitting elements. Thereafter, the semiconductor light emitting elements are dispersed in a fluid and assembled onto the assembly substrate using an electromagnetic field.

The self-assembly process may simultaneously assemble the semiconductor light emitting elements that respectively implement the R, G, and B colors on one assembly substrate, or assemble the semiconductor light emitting element of the individual color through an individual assembly substrate.

A third type is a method (S1023) for mixing the stamp process and the self-assembly process. First, the semiconductor light emitting elements are placed on the assembly substrate through the self-assembly process, and then the semiconductor light emitting elements are moved to the final substrate through the stamp process. In the case of the assembly substrate, because it is difficult to implement the assembly substrate in a large area due to a location of the assembly substrate during the self-assembly process, a contact with the fluid, an influence of the electromagnetic fields, or the like, a process of transferring the semiconductor light emitting elements to the final substrate of a large area after assembling the semiconductor light emitting elements using an assembly substrate of an appropriate area may be performed several times with the stamp process.

When a plurality of semiconductor light emitting elements constituting the individual unit pixel are placed on the final substrate, the wiring process for electrically connecting the semiconductor light emitting elements to each other is performed (S1030).

The wiring electrode formed through the wiring process electrically connects the semiconductor light emitting elements assembled or transferred onto the substrate to the substrate. In addition, a transistor for driving an active matrix may be previously formed beneath the substrate. Accordingly, the wiring electrode may be electrically connected to the transistor.

In one example, innumerable semiconductor light emitting elements are required for a large-area display device, so that the self-assembly process is preferable. In order to further improve an assembly speed, among the self-assembly processes, it may be preferred that the semiconductor light emitting elements of the respective colors are simultaneously assembled onto one assembly substrate. In addition, in order for the semiconductor light emitting elements of the respective colors to be assembled at predetermined specific positions on the assembly substrate, it may be required for the semiconductor light emitting elements to have a mutually exclusive structure.

Figure 11:
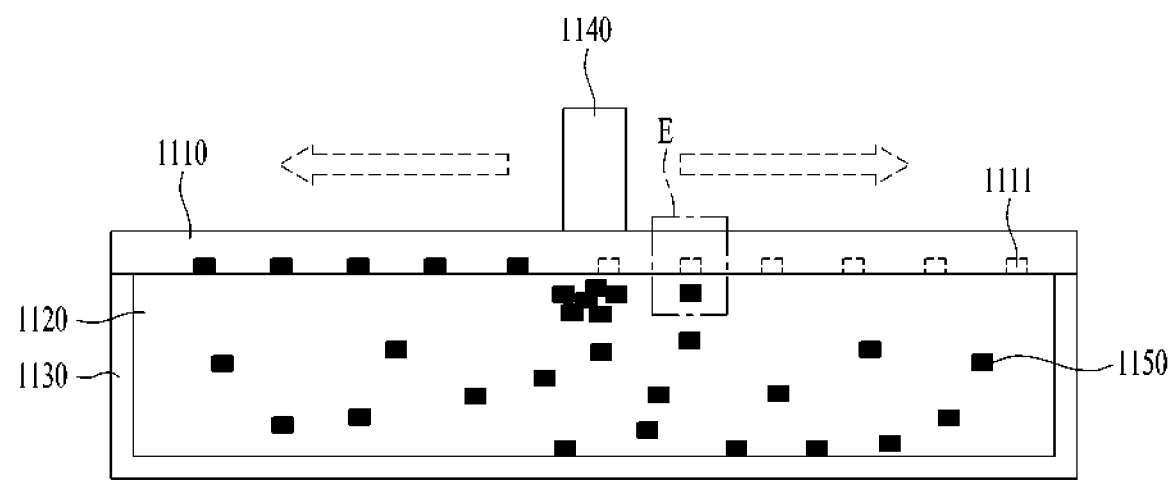
FIG. 11 is a diagram showing one embodiment of a method for assembling a semiconductor light emitting element onto a substrate by a self-assembly process.

FIG. 11 is a diagram showing one embodiment of a method for assembling a semiconductor light emitting element onto a substrate by a self-assembly process.

Figure 12:
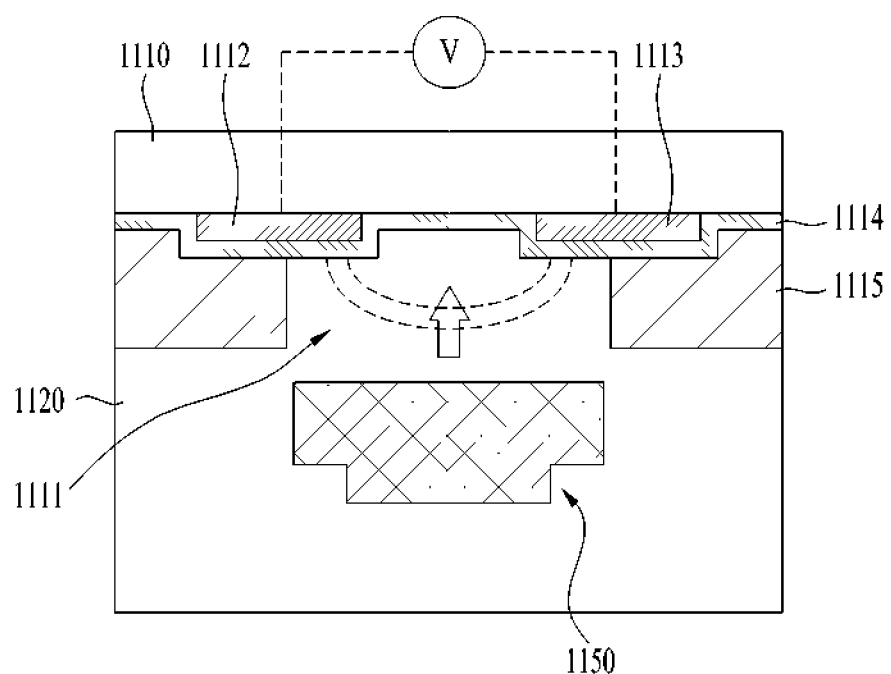
FIG. 12 is an enlarged view of a portion E in FIG. 11.

FIG. 12 is an enlarged view of a portion E in FIG. 11.

Referring to FIGS. 11 and 12, a semiconductor light emitting element 1150 may be input into a chamber 1130 filled with a fluid 1120.

Thereafter, the assembly substrate 1110 may be disposed on the chamber 1130. According to an embodiment, the assembly substrate 1110 may be introduced into the chamber 1130. In this regard, a direction in which the assembly substrate 1110 is introduced is a direction in which an assembly groove 1111 of the assembly substrate 1110 faces the fluid 1120.

A pair of electrodes 1112 and 1113 corresponding to each semiconductor light emitting element 1150 to be assembled may be formed on the assembly substrate 1110. The electrodes 1112 and 1113 may be implemented as transparent electrodes (ITO) or may be implemented using other common materials. The electrodes 1112 and 1113 correspond to assembly electrodes that stably fix the semiconductor light emitting element 1150 in contact with the assembly electrodes 1112 and 1113 by generating an electric field as a voltage is applied thereto.

Specifically, an alternating voltage may be applied to the electrodes 1112 and 1113. The semiconductor light emitting element 1150 floating around the electrodes 1112 and 1113 may have a polarity because of dielectric polarization. In addition, the dielectrically polarized semiconductor light emitting element may move in a specific direction or may be fixed by a non-uniform electric field formed around the electrodes 1112 and 1113. This is referred to as dielectrophoresis (DEP). In the self-assembly process of the present disclosure, the semiconductor light emitting element 1150 may be stably fixed into the assembly groove 1111 using the dielectrophoresis. An intensity of the dielectrophoresis (a dielectrophoretic force, DEP force) is proportional to an intensity of the electric field, and varies depending on a degree of dielectric polarization in the semiconductor light emitting element.

In addition, a gap between the assembly electrodes 1112 and 1113 is smaller than, for example, a width of the semiconductor light emitting element 1150 and a diameter of the assembly groove 1111, so that an assembly position of the semiconductor light emitting element 1150 using the electric field may be more precisely fixed.

In addition, the insulating layer 1114 is formed on the assembly electrodes 1112 and 1113 to protect the electrodes 1112 and 1113 from the fluid 1120 and prevent leakage of current flowing through the assembly electrodes 1112 and 1113. For example, the insulating layer 1114 may be formed of a single layer or multiple layers of an inorganic insulator such as silica or alumina or an organic insulator. In addition, the insulating layer 1114 may have a minimum thickness for preventing damage to the assembly electrodes 1112 and 1113 when assembling the semiconductor light emitting element 1150, and may have a maximum thickness for stably assembling the semiconductor light emitting element 1150.

A partition wall 1115 may be formed on top of the insulating layer 1114. A partial region of the partition wall 1115 may be positioned on top of each of the assembly electrodes 1112 and 1113, and the remaining region thereof may be positioned on top of the assembly substrate 1110.

For example, when manufacturing the assembly substrate 1110, as a portion of the partition wall formed on top of an entirety of the insulating layer 1114 is removed, the assembly groove 1111 in which each semiconductor light emitting element 1150 is coupled to the assembly substrate 1110 may be defined.

As shown in FIG. 12, the assembly groove 1111 into which the semiconductor light emitting element 1150 is coupled is defined in the assembly substrate 1110, and the surface in which the assembly groove 1111 is defined may be in contact with the fluid 1120. The assembly groove 1111 may guide the accurate assembly position of the semiconductor light emitting element 1150.

In addition, the partition wall 1115 may be formed with a constant inclination in a direction from an opening to a bottom surface of the assembly groove 1111. For example, by adjusting the inclination of the partition wall 1115, the assembly groove 1111 may have the opening and the bottom surface, and an area of the opening may be larger than an area of the bottom surface. Accordingly, the semiconductor light emitting element 1150 may be assembled at an accurate position on the bottom surface of the assembly groove 1111.

In one example, the assembly groove 1111 may have a shape and a size corresponding to a shape of the semiconductor light emitting element 1150 to be assembled. Accordingly, assembly of another semiconductor light emitting element or a plurality of semiconductor light emitting elements into the assembly groove 1111 may be prevented.

In addition, a depth of the assembly groove 1111 may be smaller than a vertical height of the semiconductor light emitting element 1150. Therefore, the semiconductor light emitting element 1150 may have a structure that protrudes between the partition walls 1115 and may easily come into contact with the protrusion of the transfer substrate during the transfer process that may occur after the assembly.

In addition, as shown in FIG. 12, after the assembly substrate 1110 is disposed, an assembly apparatus 1140 including a magnetic body may move along the assembly substrate 1110. The assembly apparatus 1140 may be moved while in contact with the assembly substrate 1110 in order to maximize a region to which the magnetic field is applied into the fluid 1120. For example, the assembly apparatus 1140 may include a plurality of magnetic bodies, or may include a magnetic body having a size corresponding to that of the assembly substrate 1110. In this case, a moving distance of the assembly apparatus 1140 may be limited within a predetermined range.

By a magnetic field generated by the assembly apparatus 1140, the semiconductor light emitting element 1150 in the chamber 1130 may move toward the assembly apparatus 1140.

While moving toward the assembly apparatus 1140, the semiconductor light emitting element 1150 may enter the assembly groove 1111 and come into contact with the assembly substrate 1110 as shown in FIG. 12.

In addition, the semiconductor light emitting element 1150 may include a magnetic layer therein such that the self-assembly process may be performed.

In one example, due to the electric field generated by the assembly electrodes 1112 and 1113 of the assembly substrate 1110, the semiconductor light emitting element 1150 in contact with the assembly substrate 1110 may be prevented from deviating by the movement of the assembly apparatus 1140.

Therefore, by the self-assembly scheme using the electromagnetic field shown in FIGS. 11 and 12, the plurality of semiconductor light emitting elements 1150 are simultaneously assembled onto the assembly substrate 1110.

Figure 13:
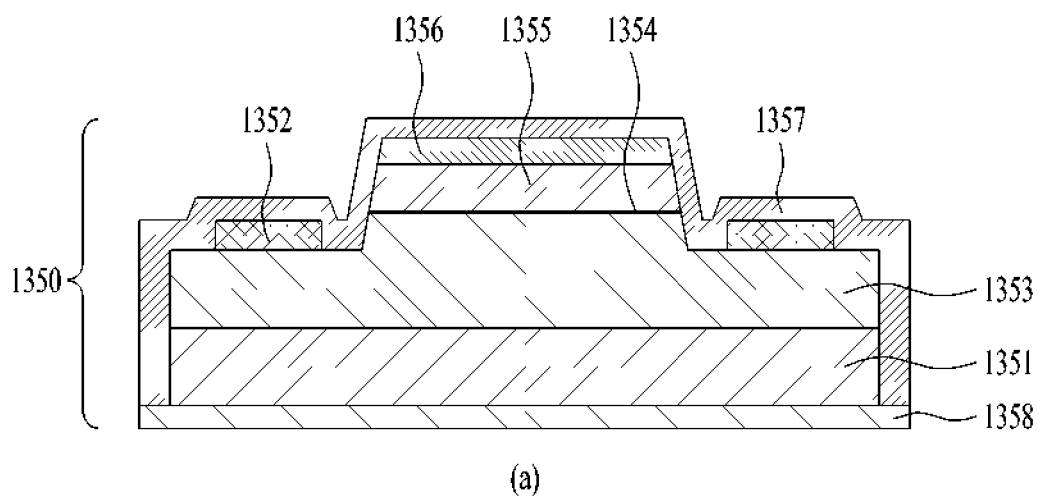
FIG. 13 shows embodiments of a horizontal type semiconductor light emitting element that may be self-assembled in a fluid.
Figure 13:
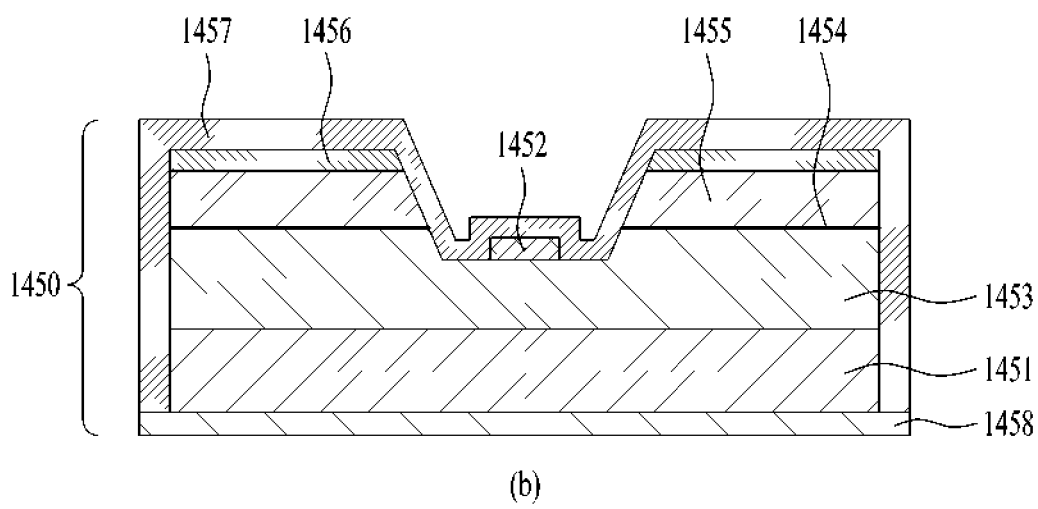

FIG. 13 shows embodiments of a horizontal type semiconductor light emitting element that may be self-assembled in a fluid.

First, (a) in FIG. 13 is a diagram illustrating a shape of a general horizontal type semiconductor light emitting element 1350. An un-doped semiconductor layer 1351, a first conductivity type semiconductor layer 1353, an active layer 1354, and a second conductivity type semiconductor layer 1355 form a stacked structure. The un-doped semiconductor layer 1351 may be formed to protect the first conductivity type semiconductor layer 1353 when the semiconductor light emitting element 1350 is separated from the growing substrate. However, the un-doped semiconductor layer 1351 is not a necessarily required structure in the general horizontal type semiconductor light emitting element, so that the un-doped semiconductor layer 1351 may be omitted.

In one example, a first conductivity type electrode 1352 is positioned on top of the first conductivity type semiconductor layer 1353, and the second conductivity type electrode 1356 is positioned on top of the second conductivity type semiconductor layer 1355. In addition, a first passivation layer 1357 for protecting the semiconductor light emitting element 1350 from an external environment may surround top and side surfaces of the element, and a bottom surface of the element may be protected by a second passivation layer 1358. Although orders in which the first passivation layer 1357 and the second passivation layer 1358 are formed are different, the first passivation layer 1357 and the second passivation layer 1358 may be made of the same material. In addition, both the first passivation layer 1357 and the second passivation layer 1358 have insulating properties.

In one example, in order to form different conductivity type electrodes on one surface of the element, in the horizontal type semiconductor light emitting element 1350 in (a) in FIG. 13, the second conductivity type semiconductor layer 1355 may be formed in a 1140 structure as shown in (a) in FIG. 13. A portion of the active layer 1354 may also be etched to form the first conductivity type electrode 1352 on the first conductivity type semiconductor layer 1353. Accordingly, a light emitting area of the semiconductor light emitting element 1350 may be proportional to a reduced area of the active layer 1354. In addition, the light emitting area may be proportional to an area of the second conductivity type semiconductor layer 1355 overlapping the active layer 1354. In addition, when the second conductivity type electrode 1356 is located on an entirety of one surface of the second conductivity type semiconductor layer 1355, the light emitting area may also be proportional to an area of the second conductivity type electrode 1356.

In one example, in order to increase the area of the active layer in the horizontal type semiconductor light emitting element, a structure of the semiconductor light emitting element 1450 as shown in (b) in FIG. 13 may be devised.

In the semiconductor light emitting element 1450, an un-doped semiconductor layer 1451, a first conductivity type semiconductor layer 1453, an active layer 1454, and a second conductivity type semiconductor layer 1455 form a stacked structure. The un-doped semiconductor layer 1451 may be formed to protect the first conductivity type semiconductor layer 1453 when the semiconductor light emitting element 1450 is separated from the growing substrate. However, the un-doped semiconductor layer 1451 is not a necessarily required structure in the general horizontal type semiconductor light emitting element, so that the un-doped semiconductor layer 1451 may be omitted.

In one example, a first conductivity type electrode 1452 is positioned on top of the first conductivity type semiconductor layer 1453, and the second conductivity type electrode 1456 is positioned on top of the second conductivity type semiconductor layer 1455. In addition, a first passivation layer 1457 for protecting the semiconductor light emitting element 1450 from an external environment may surround top and side surfaces of the element, and a bottom surface of the element may be protected by a second passivation layer 1458. Although orders in which the first passivation layer 1457 and the second passivation layer 1458 are formed are different, the first passivation layer 1457 and the second passivation layer 1458 may be made of the same material. In addition, both the first passivation layer 1457 and the second passivation layer 1458 have insulating properties.

In one example, in order to form the first conductivity type electrode 1452 of the semiconductor light emitting element 1450, a region inside each of the second conductivity type semiconductor layer 1455 and the active layer 1454 is etched, so that an area of the remaining active layer 1454 may be larger than that of the semiconductor light emitting element 1350 in (a) in FIG. 13. That is, in the semiconductor light emitting element 1350 in (a) in FIG. 13, outer surfaces of the second conductivity type semiconductor layer 1355 and the active layer 1354 are etched. However, in the semiconductor light emitting element 1450 in (b) in FIG. 13, inner surfaces of the second conductivity type semiconductor layer 1455 and the active layer 1454 are etched, so that a remaining ratio of the active layer in the element may be increased.

However, in this case, a difference in an area between one surface on which the conductivity type electrode is formed (a top surface of the second conductivity type semiconductor layer) and a surface opposite thereto (a bottom surface of the first conductivity type semiconductor layer) of the semiconductor light emitting element 1450 is reduced. Therefore, when the semiconductor light emitting element in the fluid is assembled onto the assembly substrate, a probability of being assembled in one direction may be reduced.

For the assembly onto the assembly substrate in one direction in the fluid, an assembled surface of the semiconductor light emitting element may be formed wider than a non-assembled surface thereof. As described above, the semiconductor light emitting element in the fluid may be in contact with the assembly groove of the assembly substrate by the magnetic field, and may be assembled into the assembly groove by the dielectrophoretic force through the assembly electrode. The dielectrophoretic force is proportional to the distance between the assembly electrode and the semiconductor light emitting element, and is proportional to an area at the same distance. That is, when assembling the semiconductor light emitting element in the fluid, in order to have a constant directionality, it is advantageous for one surface to be assembled of the semiconductor light emitting element to have a larger area than the other surface.

Therefore, in the case of the semiconductor light emitting element 1450 in (b) in FIG. 13, a light emission efficiency may be increased compared to the semiconductor light emitting element in (a) in FIG. 13, but the probability of the assembly in one direction is decreased, and thus there is a limit in actual use as the semiconductor light emitting element for the self-assembly.

Thus, the present disclosure will describe a horizontal type semiconductor light emitting element having a new structure that may be assembled in one direction in the fluid, and improve the light emission efficiency, which may solve the above problems, with reference to FIGS. 14 to 22.

Figure 14:
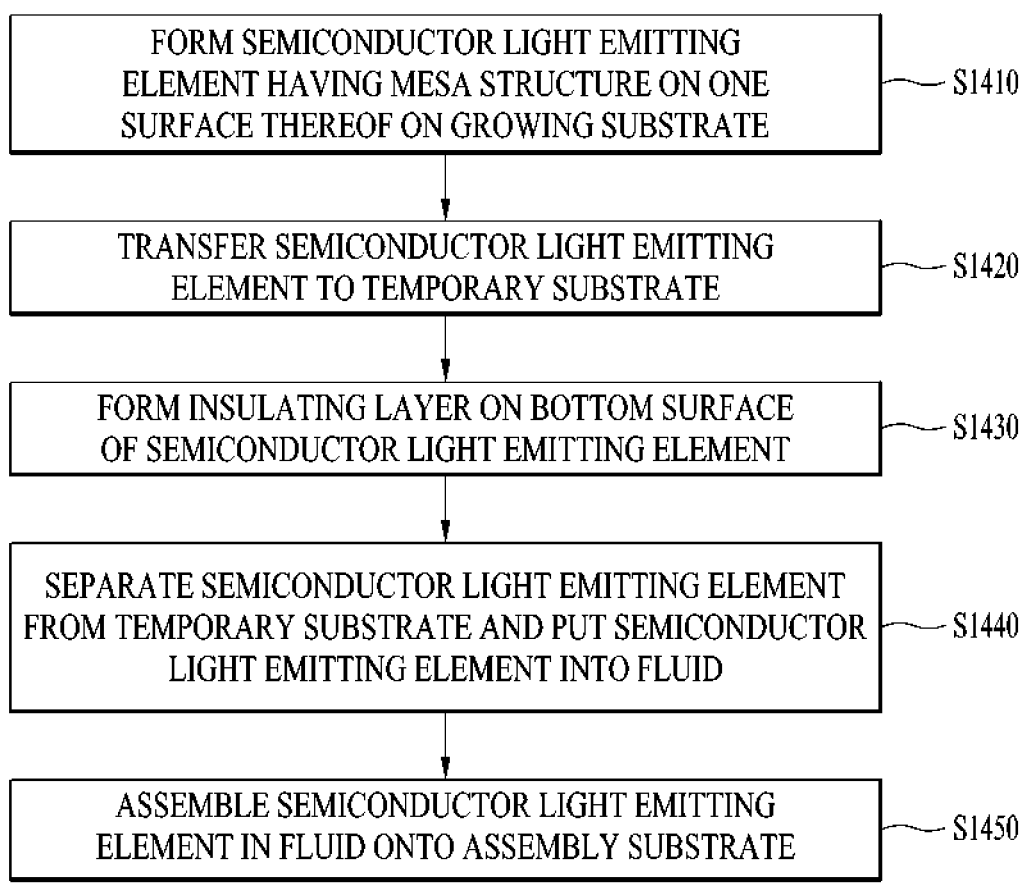
FIG. 14 is a flowchart illustrating a method for manufacturing a semiconductor light emitting element according to the present disclosure.

FIG. 14 is a flowchart illustrating a method for manufacturing a semiconductor light emitting element according to the present disclosure.

First, a semiconductor light emitting element having a mesa structure on one surface thereof is formed on the growing substrate (S1410). As will be described later, the mesa structure may be formed on one conductivity type semiconductor layer, and a central portion of the mesa structure may have an opening. That is, it may be a mesa structure having an empty region therein, for example, a ring-type mesa structure. Accordingly, a portion of the conductivity type semiconductor layer may protrude at an edge of the opening. In addition, a conductivity type electrode electrically connected to another conductivity type semiconductor layer may be positioned on a bottom surface of the opening. In one example, the semiconductor light emitting element includes a magnetic layer, so that the semiconductor light emitting element may be drawn to the assembly substrate by the magnetic apparatus in the self-assembly process.

Thereafter, the semiconductor light emitting element is transferred to a temporary substrate (S1420).

Through the transfer process (S1420), a contact surface of the semiconductor light emitting element in contact with the growing substrate may be exposed to the outside.

Thereafter, an insulating layer is formed on the exposed bottom surface of the semiconductor light emitting element (S1430). The assembly process of the element of the present disclosure is performed in the fluid, so that both a passivation layer and an insulating layer may be formed on an exterior of the semiconductor light emitting element to protect the semiconductor light emitting element from the fluid.

Thereafter, the semiconductor light emitting element is separated from the temporary substrate and put into the fluid (S1440). Thereafter, as described above with reference to FIGS. 11 to 12, the semiconductor light emitting element is assembled onto the assembly substrate using the electric field and the magnetic field in the fluid (S1450). In this regard, the assembly substrate includes an assembly groove in which the semiconductor light emitting element is assembled and assembly electrodes for applying the electric field.

Furthermore, the assembly substrate on which the semiconductor light emitting element is assembled may be separated from the fluid, and a wiring process for the semiconductor light emitting element of the assembly substrate may be performed. The assembly substrate may be a wiring substrate on which a transistor for driving an active matrix is disposed.

In one example, deleting and changing some operations of the flowchart shown in FIG. 14 at a level that those skilled in the art may understand in view of the entire meaning of the present specification also fall within another scope of the present disclosure.

Figure 15:
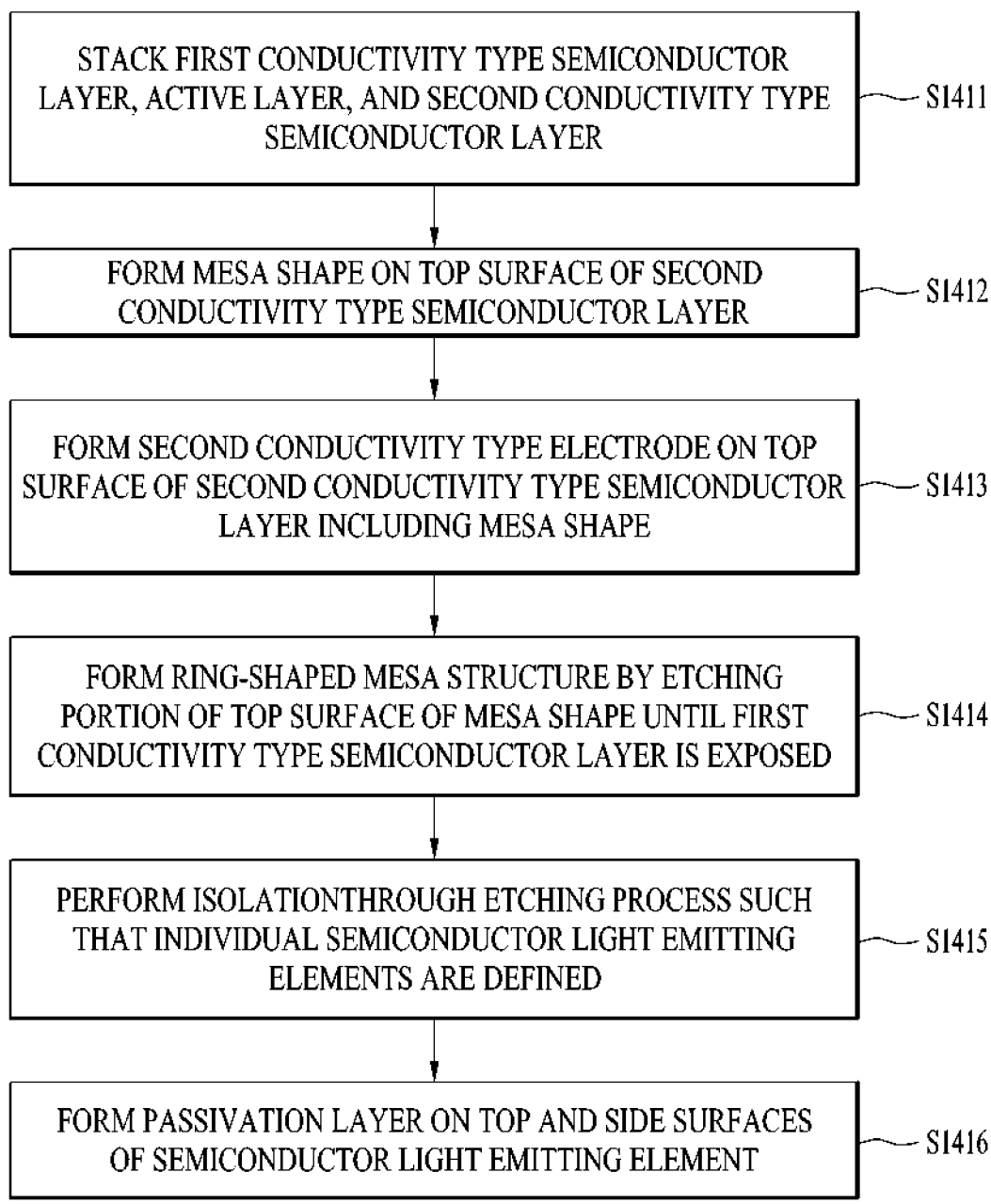
FIG. 15 is a flowchart illustrating a process of forming a semiconductor light emitting element having a mesa structure on one surface.

FIG. 15 is a flowchart illustrating a process of forming a semiconductor light emitting element having a mesa structure on one surface.

First, the first conductivity type semiconductor layer, the active layer, and the second conductivity type semiconductor layer are stacked (S1411). Thereafter, a portion of the top surface of the second conductivity type semiconductor layer is etched to form the mesa shape (S1412). Thereafter, the second conductivity type electrode layer is formed on the top surface of the second conductivity type semiconductor layer including the mesa shape (S1413).

Thereafter, the ring-shaped mesa structure is formed by etching the portion of the top surface of the mesa shape until the first conductivity type semiconductor layer is exposed (S1414). That is, the second conductivity type semiconductor layer may have the mesa structure with the empty central portion.

Thereafter, isolation is performed such that individual semiconductor light emitting elements are defined through the etching process (S1415). Finally, the passivation layer is formed on the top and side surfaces of the semiconductor light emitting element (S1416). The passivation layer may be the first passivation layer. In this case, the passivation layer on the bottom surface of the semiconductor light emitting element formed subsequently may be referred to as the second passivation layer.

In one example, deleting and changing some operations of the flowchart shown in FIG. 15 at a level that those skilled in the art may understand in view of the entire meaning of the present specification also fall within another scope of the present disclosure.

Figure 16:
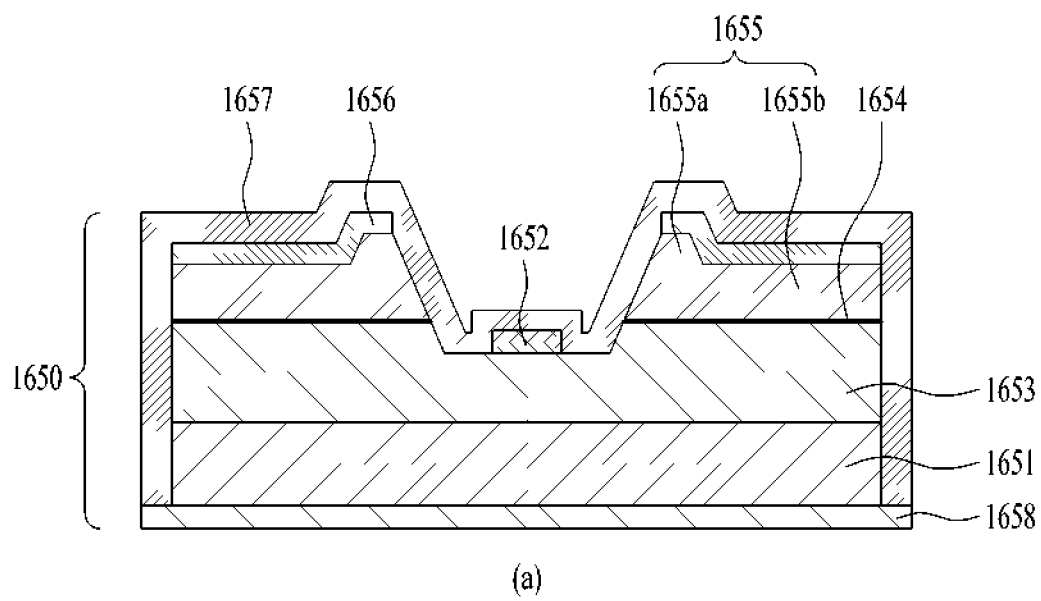
FIG. 16 is a diagram illustrating a structure of a semiconductor light emitting element of the present disclosure.
Figure 16:
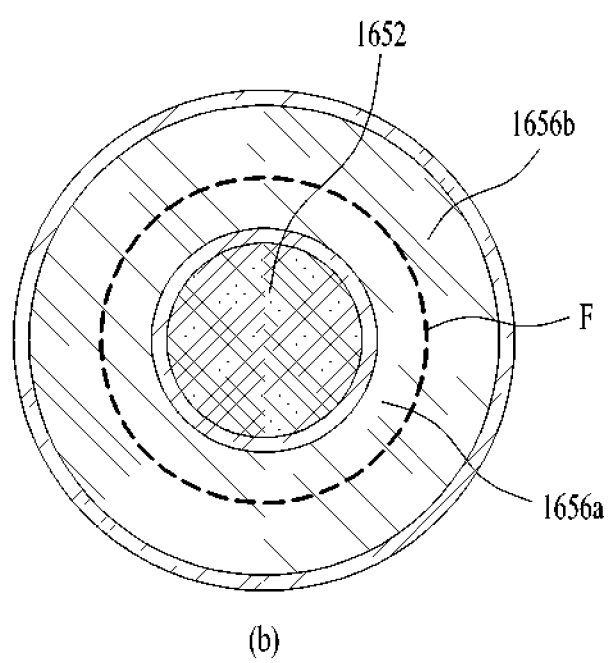

FIG. 16 is a diagram illustrating a structure of a semiconductor light emitting element of the present disclosure.

As shown in (a) in FIG. 16, a first conductivity type semiconductor layer 1653, an active layer 1654, and a second conductivity type semiconductor layer 1655 form a stacked structure. An un-doped semiconductor layer 1651 may be formed beneath the first conductivity type semiconductor layer 1653 to protect the first conductivity type semiconductor layer 1653 when a semiconductor light emitting element 1650 is transferred. However, the un-doped semiconductor layer 1651 is not necessarily required as a component of the semiconductor light emitting element 1650 of the present disclosure, so that the present disclosure is not limited thereto.

In addition, the second conductivity type semiconductor layer 1655 may be divided into a first region 1655a in which the mesa structure is formed and a remaining second region 1655b. In addition, a second conductivity type electrode 1656 surrounding an entirety of a top surface of the second conductivity type semiconductor layer 1655 may be formed. In addition, the first conductivity type electrode 1652 may be positioned on top of the first conductivity type semiconductor layer 1653 exposed as the second conductivity type semiconductor layer 1655 and the active layer 1654 are etched.

In addition, in order to protect the semiconductor light emitting element 1650 from the external environment, a first passivation layer 1657 surrounds top and side surfaces of the element, and a second passivation layer 1658 surrounds a portion of a bottom surface of the element. The second passivation layer 1658 and the first passivation layer 1657 may have insulating properties and may be the same material with different formation orders.

In one example, a structural difference between the horizontal type semiconductor light emitting element 1450 in (b) in FIG. 13 and the semiconductor light emitting element 1650 in FIG. 16 is whether the protruding mesa structure is disposed on one surface.

In the case of the horizontal type semiconductor light emitting element 1450 in (b) in FIG. 13, an area of the top surface of the second conductivity type semiconductor layer 1455 and an area of the first conductivity type semiconductor layer 1453 may not show a large difference, so that it is difficult for the semiconductor light emitting element 1450 to have an assembly directionality when being self-assembled in the fluid. In a general element structure, the assembly directionality and the light emitting area have a trade-off relationship. For example, when the area of the top surface of the second conductivity type semiconductor layer 1455 is reduced to increase the area difference, the light emitting area is reduced. When the area of the top surface of the second conductivity type semiconductor layer 1455 is increased to increase the light emitting area, it is difficult to have the assembly directionality.

On the other hand, an area of a top surface of the mesa structure 1655a of the second conductivity type semiconductor layer 1655 in (a) in FIG. 16 may be significantly smaller than an area of the first conductivity type semiconductor layer 1653, so that the semiconductor light emitting element may be assembled in a direction of the second passivation layer 1658 when being self-assembled in the fluid. In addition, in the second conductivity type semiconductor layer 1655, the second conductivity type electrode 1656 is formed on an entirety of the second conductivity type semiconductor layer 1655 including the mesa structure 1655a and the active layer 1654 is positioned beneath the second conductivity type semiconductor layer 1655, so that the light emitting area is not reduced compared to the semiconductor light emitting element 1450 in (b) in FIG. 13. That is, it is possible to have the assembly directionality through the mesa structure 1655a without reducing the area of the top surface of the second conductivity type semiconductor layer 1655.

In one example, a height of the mesa structure 1655a is preferably equal to or greater than an effective distance of the dielectrophoretic force acting on the semiconductor light emitting element from the assembly substrate. As described above, the assembly substrate has the assembly electrodes for applying the electric field, and the semiconductor light emitting element is fixed into the assembly groove of the assembly substrate by the dielectrophoretic force acting between the assembly electrodes and the semiconductor light emitting element.

For example, it has been experimentally identified that a range of the dielectrophoretic force acting on a circular semiconductor light emitting element having a width of 50 μm and a height of 10 μm is around 200 nm. Therefore, when the height of the mesa structure 1655a is greater than 200 nm, the dielectrophoretic force will act only on the top surface of the mesa structure 1655a. However, when the height of the mesa structure 1655a is equal to or smaller than 100 nm, the dielectrophoretic force may act on an entirety of one surface of the second conductivity type semiconductor layer 1655 including the mesa structure 1655a. Therefore, even when the second conductivity type semiconductor layer 1655 has the mesa structure 1655a, it is difficult to have a large difference from the area of the first conductivity type semiconductor layer 1653. After all, when the height of the mesa structure 1655a is greater than 200 nm, the semiconductor light emitting element will be assembled in a direction of the first conductivity type semiconductor layer 1653 and the second passivation layer 1658. However, when the height of the mesa structure 1655a is equal to or smaller than nm (e.g., 100 nm), it is difficult to determine in which direction the semiconductor light emitting element is assembled on the assembly substrate.

(b) in FIG. 16 is a plan view of the semiconductor light emitting element of the present disclosure viewed from above. In order to clearly observe a formation position of the second conductivity type electrode, the first passivation layer 1657 is omitted. As shown in (b) in FIG. 16, the first conductivity type electrode 1652 connected to the first conductivity type semiconductor layer is located at a center of the element. The second conductivity type electrode is located outwardly of the center, and a second conductivity type electrode 1656a surrounding the mesa structure and a second conductivity type electrode 1656b surrounding the remaining region are positioned around a circular closed curve F. As shown in (b) in FIG. 16, it may be seen that, even when the mesa structure is formed, the light emitting area is not reduced because the second conductivity type electrode is located in most regions of one surface of the element. In one example, the semiconductor light emitting element of the present disclosure is shown in a circular shape in (b) in FIG. 16, but the present disclosure is not limited to the shape in the drawing. Therefore, in the process of forming the element, various shapes of semiconductor light emitting elements may be manufactured depending on a shape of an etching pattern. However, in the semiconductor light emitting element of the present disclosure, the conductivity type semiconductor layer forming one surface of the element may include the mesa structure with the empty interior.

Figure 17:
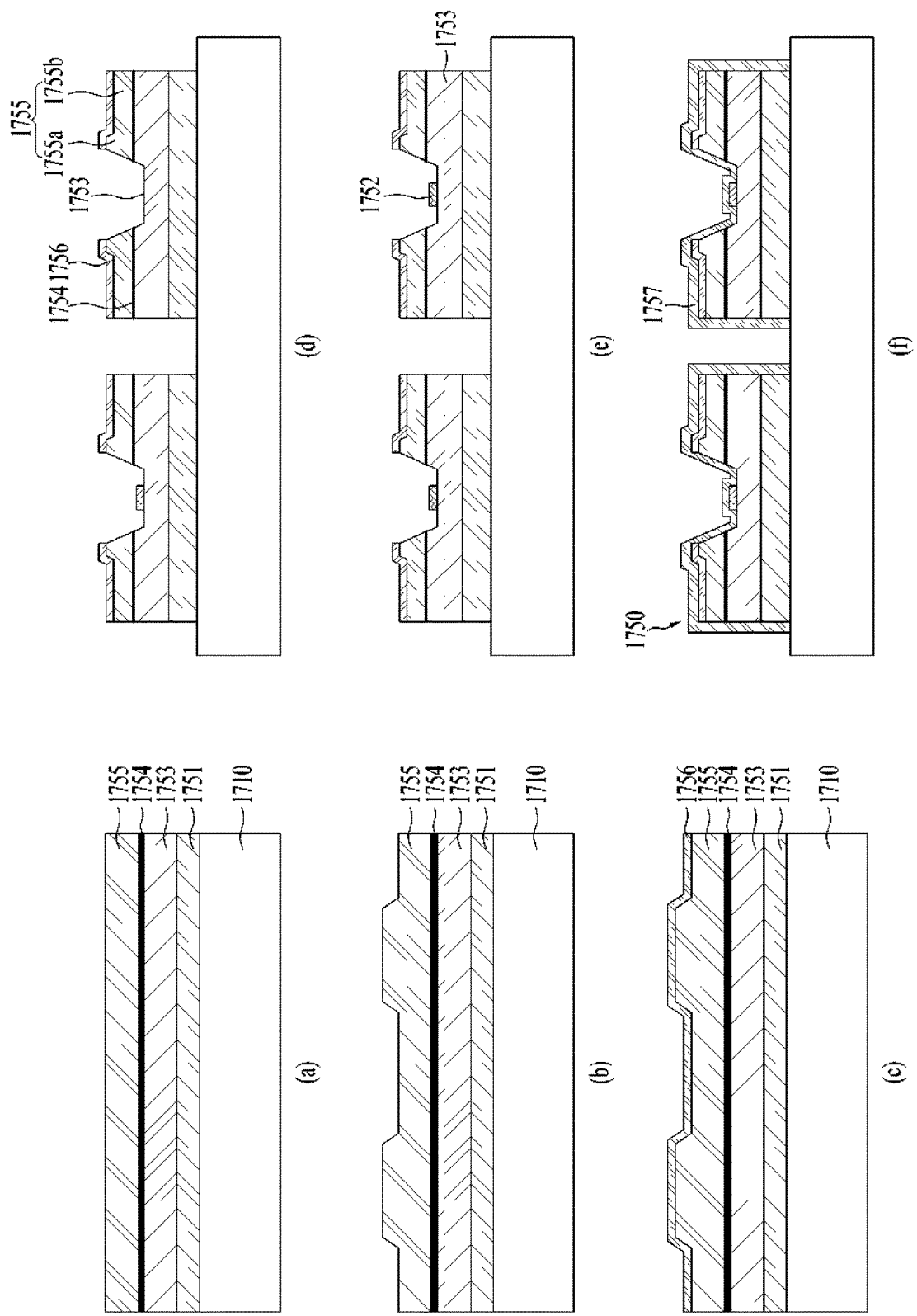
FIG. 17 shows cross-sectional views illustrating a process of forming a semiconductor light emitting element in FIG. 15.

FIG. 17 shows cross-sectional views illustrating a process of forming a semiconductor light emitting element in FIG. 15.

As shown in (a) in FIG. 17, first, on a growing substrate 1710, an un-doped semiconductor layer 1751, a first conductivity type semiconductor layer 1753, an active layer 1754, and a second conductivity type semiconductor layer 1755 are stacked. As described above, the un-doped semiconductor layer 1751 may be optional.

Thereafter, as shown in (b) in FIG. 17, a mesa shape is formed by etching a portion of a top surface of the second conductivity type semiconductor layer 1755. In this case, the portion may be etched such that a height of the mesa shape is equal to or greater than the effective distance to which the dielectrophoretic force is not applied in the subsequent assembly process.

Thereafter, as shown in (c) in FIG. 17, a second conductivity type electrode layer 1756 is formed on an entirety of the top surface of the second conductivity type semiconductor layer 1755 having the mesa shape. In this regard, the second conductivity type electrode layer 1756 may be a transparent electrode layer such as an ITO, and may be formed to be very thin to be removed by the etching process.

Thereafter, as shown in (d) in FIG. 17, a portion of the mesa shape of the second conductivity type semiconductor layer 1755 is etched until the first conductivity type semiconductor layer 1753 is exposed. Through the above process, the second conductivity type electrode 1756, the second conductivity type semiconductor layer 1755, the active layer 1754, and the first conductivity type semiconductor layer 1753 may be partially etched. In addition, the second conductivity type semiconductor layer 1755 may be divided into a first region 1755a in which the mesa structure is formed and a remaining second region 1755b.

Thereafter, the isolation is performed such that the individual semiconductor light emitting elements are defined through the etching process. In addition, as shown in (e) in FIG. 17, a first conductivity type electrode 1752 is formed on the exposed first conductivity type semiconductor layer 1753 during the process in (d) in FIG. 17.

Finally, a first passivation layer 1757 is formed on top and side surfaces of the semiconductor light emitting element isolated in (e) in FIG. 17. Therefore, in the case of the semiconductor light emitting element 1750 formed on the growing substrate, regions other than a surface in contact with the growing substrate may be protected by the first passivation layer 1757.

Figure 18:
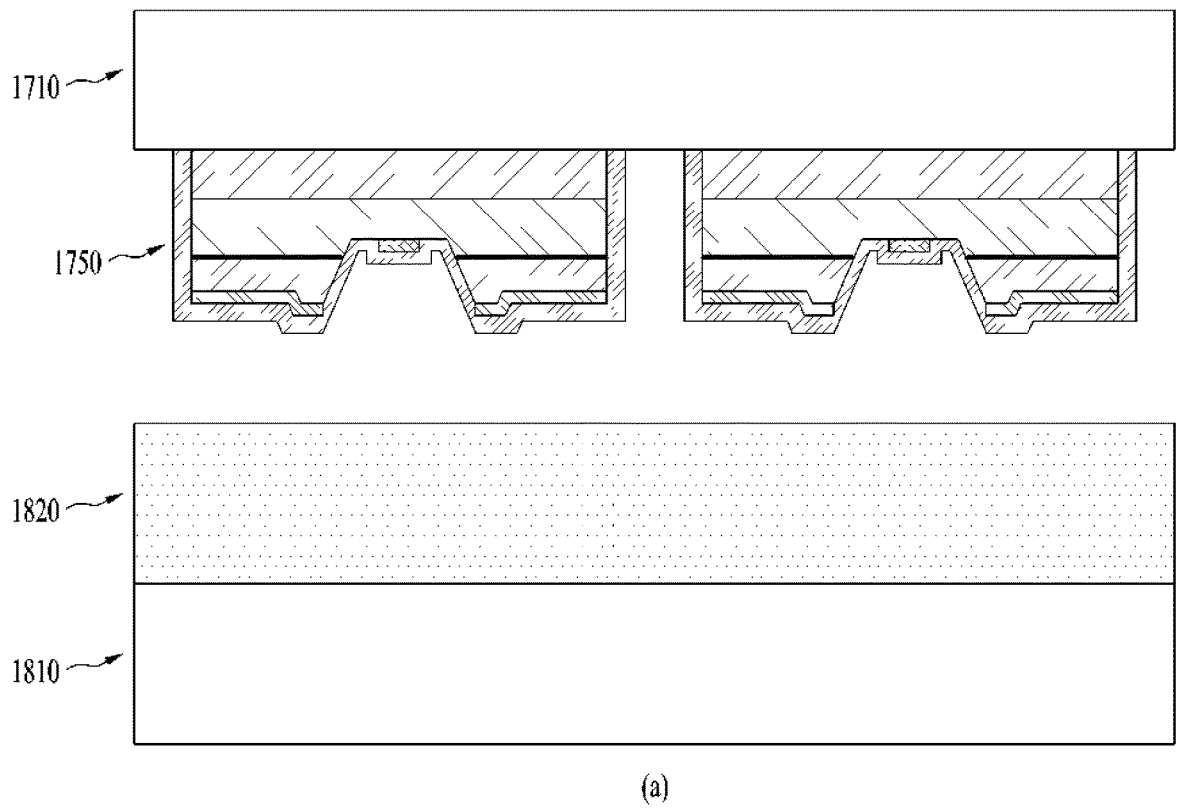
FIG. 18 shows cross-sectional views illustrating a process of transferring a semiconductor light emitting element in FIG. 17 onto a temporary substrate.
Figure 18:
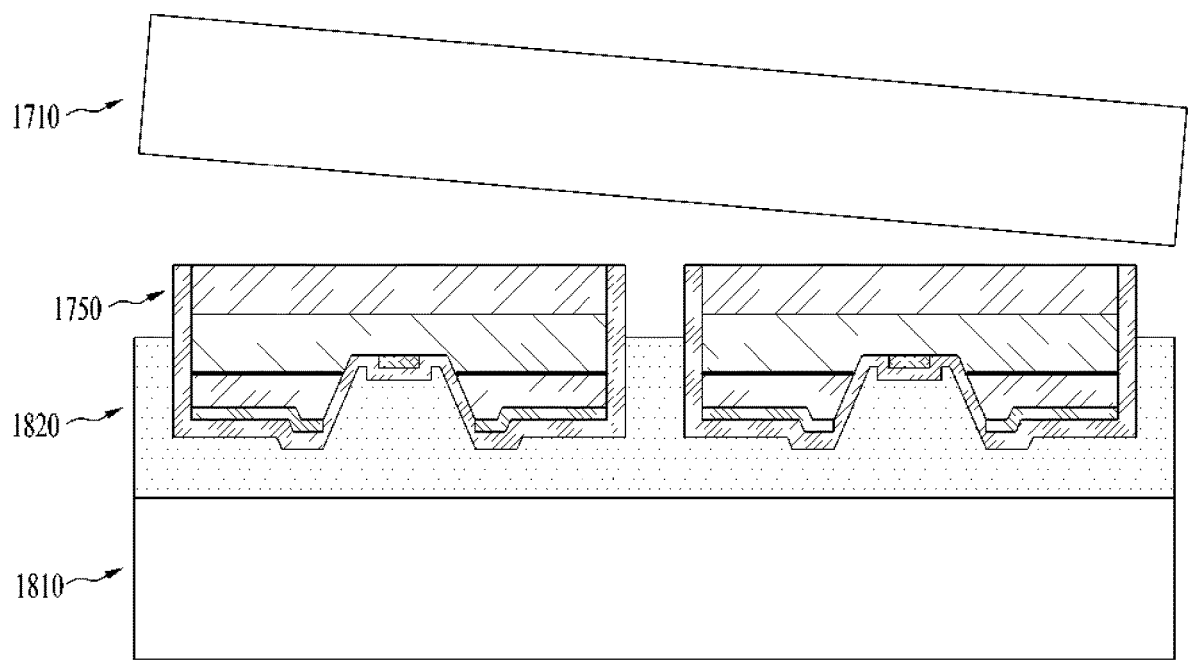

FIG. 18 shows cross-sectional views illustrating a process of transferring a semiconductor light emitting element in FIG. 17 onto a temporary substrate.

As shown in (a) in FIG. 18, the semiconductor light emitting element 1750 formed on the growing substrate 1710 may be transferred onto a temporary substrate 1810 having an adhesive layer 1820 for a subsequent process.

The adhesive layer 1820 may be an organic stamp layer, and may include a protrusion corresponding to the semiconductor light emitting element 1750.

As shown in (b) in FIG. 18, when the semiconductor light emitting element 1750 comes into contact with the adhesive layer 1820 of the temporary substrate 1810, and then a laser or the like is irradiated to a rear surface of the growing substrate 1710, the semiconductor light emitting element 1750 may be transferred from the growing substrate 1710 onto the temporary substrate 1810.

The reason for transferring the semiconductor light emitting element onto the temporary substrate 1810 is to expose one surface of the semiconductor light emitting element 1750 that is not exposed on the growing substrate 1710. The second passivation layer or the insulating layer may be formed on the exposed surface.

Figure 19:
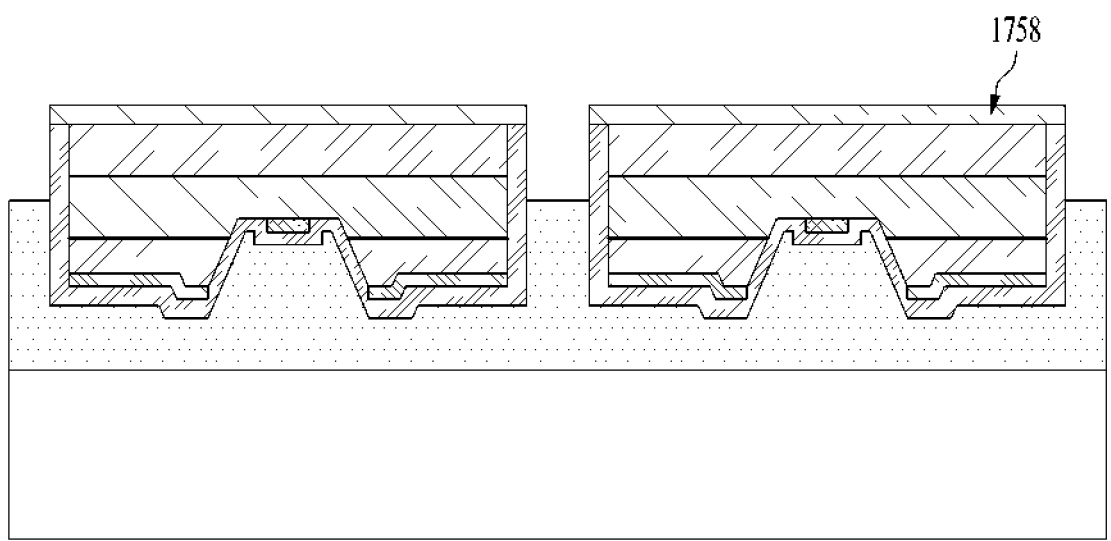
FIG. 19 is a view illustrating a process of forming an insulating layer on one surface of a semiconductor light emitting element in FIG. 18 and then individually separating the semiconductor light emitting elements.
Figure 19:
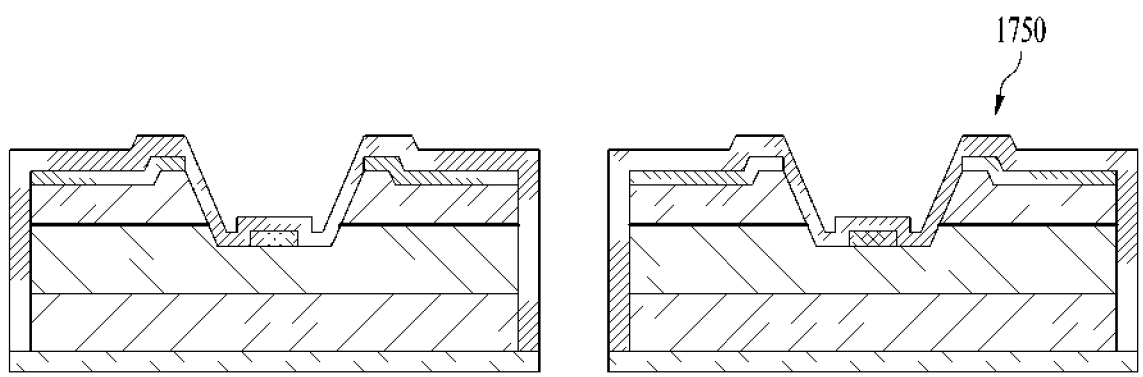

FIG. 19 is a view illustrating a process of forming an insulating layer on one surface of a semiconductor light emitting element in FIG. 18 and then individually separating the semiconductor light emitting elements.

As shown in (a) in FIG. 19, an insulating layer (or a second passivation layer) 1758 is formed on one surface of the first conductivity type semiconductor layer exposed through the transfer process.

Thereafter, the adhesive layer of the temporary substrate is removed to individually separate the semiconductor light emitting elements 1750 as shown in (b) in FIG. 19. The adhesive layer of the temporary substrate, which is made of the organic material, may be easily removed by treatment with a chemical solution. In one example, the top and side surfaces of the semiconductor light emitting element 1750 are protected by the first passivation layer, and the bottom surface thereof is protected by the second passivation layer (or the insulating layer), so that the semiconductor light emitting element 1750 may not be damaged by the treatment with the chemical solution.

Figure 20:
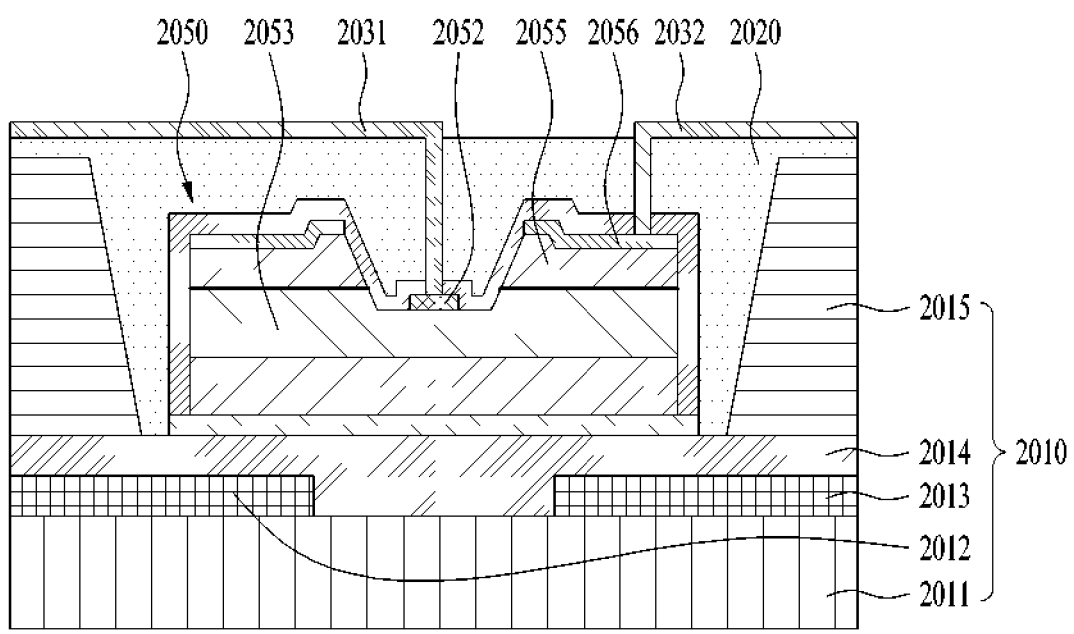
FIG. 20 is a cross-sectional view after performing a wiring process for a semiconductor light emitting element assembled onto an assembly substrate.

FIG. 20 is a cross-sectional view after performing a wiring process for a semiconductor light emitting element assembled onto an assembly substrate.

Specifically, an individually separated semiconductor light emitting element 2050 may be mounted in an assembly groove of an assembly substrate 2010 by an electric field and a magnetic field in a fluid. Therefore, as shown in FIG. 20, when the assembly process is completed, the semiconductor light emitting element 2050 is positioned in the assembly groove of the assembly substrate 2010. In the assembly substrate, assembly electrodes 2012 and 2013 for generating the electric field on a substrate 2011, a dielectric film 2014 for protecting the assembly electrodes 2012 and 2013, and a partition wall 2015 for defining the assembly groove may be located. In addition, the partition wall 2015 may have a structure in which one surface thereof is inclined to guide the semiconductor light emitting element 2050 into the assembly groove.

An interlayer insulating film 2020 is formed on top of the semiconductor light emitting element 2050 assembled onto the assembly substrate 2010, and wiring electrodes 2031 and 2032 electrically connected to the semiconductor light emitting element 2050 are formed. The wiring electrodes may be composed of a first wiring electrode 2031 electrically connected to a first conductivity type semiconductor layer 2053 and a first conductivity type electrode 2052 of the semiconductor light emitting element 2050, and a second wiring electrode 2032 electrically connected to a second conductivity type semiconductor layer 2055 and a second conductivity type electrode 2056 of the semiconductor light emitting element 2050.

Figure 21:
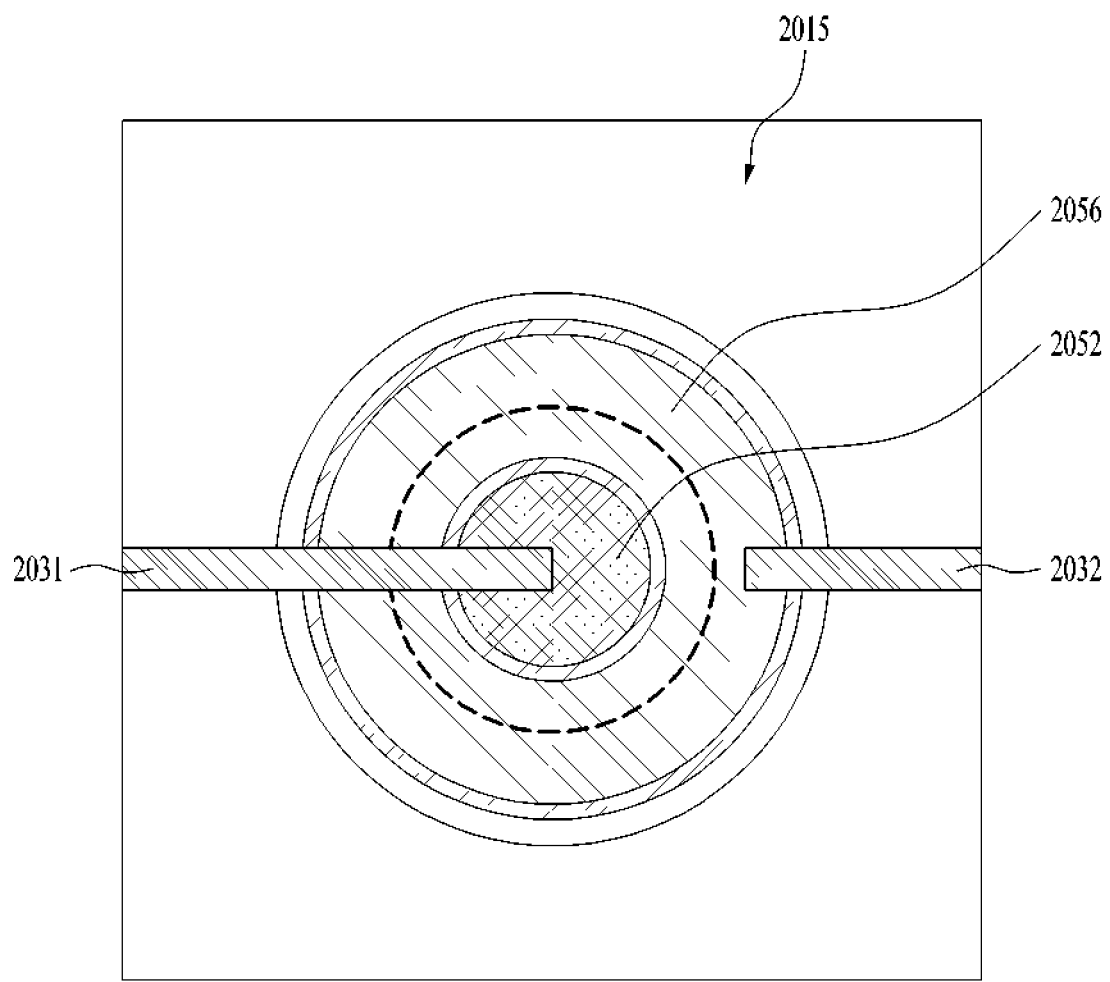
FIG. 21 is a plan view after performing a wiring process for a semiconductor light emitting element assembled onto an assembly substrate.

FIG. 21 is a plan view after performing a wiring process for a semiconductor light emitting element assembled onto an assembly substrate.

In order to clearly observe a light emitting region of the semiconductor light emitting element, the interlayer insulating film covering the top of the semiconductor light emitting element is omitted. The assembly groove is defined by the partition wall 2015, and the semiconductor light emitting element is positioned inside the assembly groove. In addition, the first wiring electrode 2031 electrically connected to the first conductivity type electrode 2052 of the semiconductor light emitting element and the second wiring electrode 2031 electrically connected to the second conductivity type electrode 2056 may be formed as shown in FIG. 21.

Figure 22:
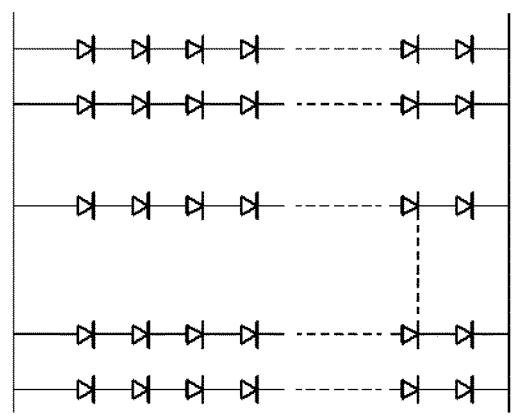
FIG. 22 is a diagram illustrating a simple circuit diagram for driving a display device of the present disclosure and an actual light emission image of the present disclosure.
Figure 22:
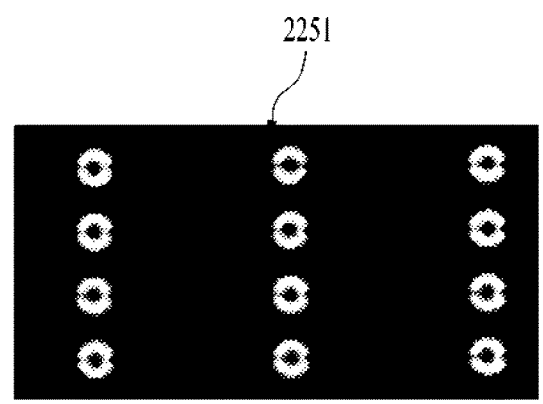

FIG. 22 is a diagram illustrating a simple circuit diagram for driving a display device of the present disclosure and an actual light emission image of the present disclosure.

More than millions of semiconductor light emitting elements of the assembly substrate may be assembled onto the assembly substrate for the realization of the display device. As shown in (a) in FIG. 22, each semiconductor light emitting element 2250 serves as one diode. (a) in FIG. 22 is a simple circuit diagram of a case in which voltage is simultaneously applied to the plurality of assembled semiconductor light emitting elements 2250. The semiconductor light emitting elements may be connected to each other in series, and may emit light at once through application of (+)/(−) voltage.

For example, (b) in FIG. 22 is an actual image in which the plurality of semiconductor light emitting elements 2251 simultaneously emit light. In the semiconductor light emitting elements of the present disclosure, one surface having the mesa structure becomes a light emitting surface, and a central region of the element has an empty structure. Therefore, as shown in (b) in FIG. 22, the central region of the semiconductor light emitting element 2251 is dark, and a peripheral portion thereof emits light. In addition, the assembly in one direction is possible within the assembly substrate by forming the mesa structure, so that it may be seen that all semiconductor light emitting elements 2251 have the same light emitting pattern as shown in (b) in FIG. 22. In the case of the general horizontal semiconductor light emitting structure, there is a constraint that the light emitting area must be greatly reduced for the assembly in one direction. However, as shown in (b) in FIG. 22, the semiconductor light emitting element of the present disclosure has a technical difference in that it may have the one directional assembly characteristic in the fluid while using most regions in the element as the light emitting region.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

The invention claimed is:

1. A device comprising a plurality of semiconductor light emitting elements positioned within an assembly substrate using at least one of an electric field and a magnetic field,
wherein each of at least one of the plurality of semiconductor light emitting elements includes:
a first conductivity type semiconductor layer;
a second conductivity type semiconductor layer positioned on the first conductivity type semiconductor layer, wherein the second conductivity type semiconductor layer includes an opening defined therein;
an active layer positioned between the first conductivity type semiconductor layer and the second conductivity type semiconductor layer;
a first conductivity type electrode positioned in the opening of the second conductivity type semiconductor layer, and electrically connected to the first conductivity type semiconductor layer; and
a second conductivity type electrode positioned on the second conductivity type semiconductor layer, wherein the second conductivity type semiconductor layer includes a first region being adjacent to the opening and a second region being adjacent to the first region, and wherein the first region has a mesa structure protruding beyond a top surface of the second region.

2. The device of claim 1, wherein the second conductivity type electrode is composed of a transparent electrode, and wherein the second conductivity type electrode is provided on an entire top surface of the second conductivity type semiconductor layer including a top surface of the mesa structure of the first region.

3. The device of claim 1, wherein the assembly substrate includes a plurality of assembly electrodes configured to generate a dielectrophoretic force to be applied to one of the plurality of semiconductor light emitting elements by the electric field.

4. The device of claim 3, wherein the mesa structure of the first region in the second conductivity type semiconductor layer includes:
a first sidewall formed by partially etching the second conductivity type semiconductor layer, and
a second sidewall adjacent to the opening and formed by partially etching the second conductivity type semiconductor layer, the active layer, and the first conductivity type semiconductor layer.

5. The device of claim 4, wherein a height of the first sidewall of the mesa structure is equal to or greater than an effective distance of the dielectrophoretic force acting on the one of the plurality of semiconductor light emitting elements by the assembly substrate.

6. The device of claim 1, wherein the each semiconductor light emitting element further includes a passivation layer covering a surface of the semiconductor light emitting element.

7. The device of claim 6, wherein the passivation layer includes at least one of the following:
a first passivation layer surrounding a top surface and side surfaces of the semiconductor light emitting element, and
a second passivation layer surrounding a bottom surface of the semiconductor light emitting element.

8. The device of claim 4, wherein the each semiconductor light emitting element further includes a passivation layer covering a surface of the semiconductor light emitting element, and
wherein the second conductivity type electrode is positioned on the first sidewall of the mesa structure, and the passivation layer is positioned on the second sidewall of the mesa structure.

9. The device of claim 1, wherein the mesa structure of the first region in the second conductivity type semiconductor layer is a ring-shaped mesa structure.

10. The device of claim 1, wherein the each semiconductor light emitting element further includes an un-doped semiconductor layer on a bottom surface of the first conductivity type semiconductor layer.

11. The device of claim 1, wherein the each semiconductor light emitting element further includes a magnetic layer.

12. The device of claim 1, wherein the each semiconductor light emitting element is a light emitting diode (LED) having a size of a micrometer unit (a micro-LED).

13. The device of claim 1, wherein the device is a display device having the plurality of semiconductor light emitting elements configured to generate different colors.

14. A semiconductor light emitting device comprising:
a first conductivity type semiconductor layer;
an active layer provided on the first conductivity type semiconductor layer;
a second conductivity type semiconductor layer provided on the active layer,
wherein an opening is defined through the second conductivity type semiconductor layer, the active layer and a portion of the first conductivity type semiconductor layer;
a first conductivity type electrode provided in the opening and on the first conductivity type semiconductor layer; and
a second conductivity type electrode provided on the second conductivity type semiconductor layer,
wherein a portion of the second conductivity type semiconductor layer surrounding the opening is raised in a mesa shape in comparison to a remaining portion of the second conductivity type semiconductor layer.

15. The semiconductor light emitting device of claim 14, wherein the raised mesa shaped portion of the second conductivity type semiconductor layer has a ring configuration.

16. The semiconductor light emitting device of claim 14, further comprising:
a first passivation layer covering the second conductivity type electrode, side and bottom surfaces of the opening, and the first conductivity type electrode provided; and
a second passivation layer provided below a bottom surface of the first conductivity type semiconductor layer.

* * * * *